United States Patent
Chen et al.

(10) Patent No.: US 11,943,584 B2
(45) Date of Patent: Mar. 26, 2024

(54) MEMS MICROPHONE

(71) Applicant: Fortemedia, Inc., Santa Clara, CA (US)

(72) Inventors: Chih-Yuan Chen, Tainan (TW); Jien-Ming Chen, Tainan (TW); Feng-Chia Hsu, Tainan (TW); Wen-Shan Lin, Tainan (TW); Nai-Hao Kuo, Tainan (TW)

(73) Assignee: FORTEMEDIA, INC., Alviso, CA (US)

( * ) Notice: Subject to any disclaimer, the term of this patent is extended or adjusted under 35 U.S.C. 154(b) by 140 days.

(21) Appl. No.: 17/715,278

(22) Filed: Apr. 7, 2022

(65) Prior Publication Data

US 2023/0063234 A1    Mar. 2, 2023

Related U.S. Application Data

(60) Provisional application No. 63/238,857, filed on Aug. 31, 2021.

(51) Int. Cl.
*H04R 19/04* (2006.01)
*B81B 3/00* (2006.01)
(Continued)

(52) U.S. Cl.
CPC ............ *H04R 19/04* (2013.01); *B81B 3/001* (2013.01); *B81B 3/0051* (2013.01);
(Continued)

(58) Field of Classification Search
CPC ..... B81B 3/001; B81B 3/0051; B81B 3/0072; B81B 2203/019; B81B 3/007; B81B 2201/0257; B81B 2203/0127; B81B 7/0032; B81B 7/0058; B81B 7/0077; B81B 2201/0235; B81B 2203/0315; B81B 2207/012; B81B 2207/09; B81B 2207/092; B81B 2207/096; B81B 7/0064; H04R 7/16; H04R 1/28; H04R 2410/03; H04R 19/04; H04R 7/04; H04R 7/18; H04R 2201/003;
(Continued)

(56) References Cited

U.S. PATENT DOCUMENTS

| | | | |
|---|---|---|---|
| 8,921,956 B2 * | 12/2014 | Dehe ................... | B81C 1/00166 381/174 |
| 9,462,389 B2 * | 10/2016 | Wang ....................... | H04R 7/16 |

(Continued)

FOREIGN PATENT DOCUMENTS

| CN | 213661943 U | * | 7/2021 | ............. H04R 19/04 |
|---|---|---|---|---|
| KR | 20180066577 A | * | 6/2018 | ............. G01H 11/00 |

*Primary Examiner* — Angelica M McKinney
(74) *Attorney, Agent, or Firm* — McClure, Qualey & Rodack, LLP

(57) ABSTRACT

A micro-electro-mechanical system (MEMS) microphone is provided. The MEMS microphone includes a substrate, a diaphragm, a backplate and a first protrusion. The substrate has an opening portion. The diaphragm is disposed on one side of the substrate and extends across the opening portion of the substrate. The backplate includes a plurality of acoustic holes. The backplate is disposed on one side of the diaphragm. An air gap is formed between the backplate and the diaphragm. The first protrusion extends from the backplate towards the air gap.

20 Claims, 21 Drawing Sheets

(51) Int. Cl.
*H04R 7/04* (2006.01)
*H04R 7/16* (2006.01)

(52) U.S. Cl.
CPC ............. *B81B 3/0072* (2013.01); *H04R 7/04* (2013.01); *H04R 7/16* (2013.01); *B81B 2201/0257* (2013.01); *B81B 2203/0127* (2013.01); *B81B 2203/019* (2013.01); *H04R 2201/003* (2013.01)

(58) Field of Classification Search
CPC .. H04R 7/20; H04R 2207/021; H04R 19/005; H04R 1/04; H04R 1/2807; H04R 1/342; H04R 1/083; H04R 17/02; H04R 17/10; H04R 19/016; H04R 2201/02; H04R 2217/00; H04R 2201/029; H04R 1/222; B33Y 80/00; B33Y 10/00; B22F 10/28; B81C 1/00269; B81C 1/00888; B81C 2201/034; B81C 2203/0118; B81C 2203/032; B81C 2203/0792
See application file for complete search history.

(56) References Cited

U.S. PATENT DOCUMENTS

| | | | |
|---|---|---|---|
| 10,343,898 B1* | 7/2019 | Chen | H04R 7/08 |
| 10,766,763 B2* | 9/2020 | Lin | B81B 1/004 |
| 2017/0055085 A1* | 2/2017 | Wang | H04R 19/04 |
| 2021/0037320 A1* | 2/2021 | Chen | H04R 7/16 |

* cited by examiner

MEMS MICROPHONE

CROSS REFERENCE TO RELATED APPLICATIONS

This application claims the benefit of U.S. Provisional Application No. 63/238,857, filed on Aug. 31, 2021, the entirety of which is incorporated by reference herein.

BACKGROUND OF THE DISCLOSURE

Field of the Disclosure

The disclosure relates to an acoustic transducer, and more particularly to a micro-electro-mechanical system (MEMS) microphone.

Description of the Related Art

The new generation of smartphones have a higher specification than the old generation. In the MEMS microphone of a smartphone, the specification includes performance and reliability. Especially, in terms of reliability, the microphone has to operate normally under conditions of high temperature, high humidity, and extremely high air pressure.

The MEMS capacitive microphone has two parallel plates which include a backplate and a diaphragm, between which a variant capacitance is formed. The diaphragm vibrates when acoustic pressure is applied to it, thereby producing a variation in the capacitance between the backplate and the diaphragm.

In general, the MEMS capacitive microphone structure cannot limit the deformation of the diaphragm. In a high air-pressure operating environment, a large amount of deformation will occur on the diaphragm. This may cause the MEMS microphone to crack.

BRIEF SUMMARY OF THE DISCLOSURE

In accordance with one embodiment of the disclosure, a micro-electro-mechanical system (MEMS) microphone is provided. The MEMS microphone includes a substrate, a diaphragm, a backplate and a first protrusion. The substrate has an opening portion. The diaphragm is disposed on one side of the substrate and extends across the opening portion of the substrate. The backplate includes a plurality of acoustic holes. The backplate is disposed on one side of the diaphragm. An air gap is formed between the backplate and the diaphragm. The first protrusion extends from the backplate towards the air gap. The first protrusion forms a polyline or a curve from a top view.

In some embodiments, the diaphragm includes a ventilation hole.

In some embodiments, the MEMS microphone further includes a protective layer covering the first protrusion. In some embodiments, the protective layer includes conductive material.

In some embodiments, the MEMS microphone further includes a second protrusion extending from the backplate towards the air gap. In some embodiments, the height of the second protrusion is shorter than that of the first protrusion.

In some embodiments, the first protrusion surrounds at least one acoustic hole. In some embodiments, the first protrusion surrounds one, two or four acoustic holes. In some embodiments, the first protrusion leaves at least one opening. In some embodiments, the first protrusion surrounds the at least one acoustic hole and leaves two or four openings.

In some embodiments, the MEMS microphone further includes a third protrusion extending from the backplate towards the air gap. In some embodiments, the third protrusion is located between the second protrusions. In some embodiments, the third protrusion is located on the center of the backplate. In some embodiments, the height of the third protrusion is similar to that of the first protrusion. In some embodiments, the third protrusion surrounds at least one acoustic hole and forms a closed ring or polyline when viewed from from a top view.

In some embodiments, the first protrusion, the second protrusion and the third protrusion include insulating materials.

In some embodiments, the MEMS microphone further includes a pillar disposed on the backplate. In some embodiments, the pillar is disposed on a center of the backplate, and it is in contact with the diaphragm. In some embodiments, the pillar includes insulating material.

In some embodiments, the MEMS microphone further includes a dielectric layer disposed between the substrate and the backplate. In some embodiments, the diaphragm is inserted in the dielectric layer.

In some embodiments, the backplate includes a conductive layer, a first insulating layer and a second insulating layer. In some embodiments, the conductive layer is disposed on the dielectric layer. The first insulating layer is disposed on the conductive layer. The second insulating layer is disposed on the first insulating layer.

In some embodiments, the distance between the center of the backplate and the center of the ventilation hole is defined as a first distance. The distance between the center of the backplate and the center of the first protrusion is defined as a second distance. The first distance is greater than the second distance.

In some embodiments, the distance between the first protrusion and the diaphragm is greater than 0.1 μm.

In some embodiments, the width of the first protrusion is greater than 0.5 μm.

In some embodiments, the third protrusion forms a closed ring or polyline from a top view.

In some embodiments, the first protrusion forms two arcs around an acoustic hole from a top view.

In some embodiments, the ventilation hole includes a plurality of outer slots and inner slots formed in the annular area of the diaphragm and configured in concentric circles around the center of the diaphragm, wherein the outer slots and the inner slots respectively have a c-shaped structure and are oriented toward opposite directions, and the outer slots and the inner slots are arranged in a staggered manner with respect to the center of the diaphragm.

In some embodiments, the first protrusion is distributed along the center of the diaphragm.

In the present disclosure, the protrusions from the backplate limit the deformation of the diaphragm and reduce stress, thereby enhancing the reliability of the microphone against air pressure.

In the present disclosure, the MEMS microphone structure has the protrusions from the backplate. When the pressure is induced by the air gun, the diaphragm of the microphone has large deformation and stress because of the large pressure difference. However, the protrusions from the backplate can limit the deformation of the diaphragm which can reduce the stress and prevent cracking.

In the present disclosure, there are two advantages to the polyline (curve) protrusion structure than the single-point protrusion. First, the polyline (curve) protrusion structure has a larger area which can decrease the stress on the diaphragm when there is a collision between the diaphragm and the protrusions. Second, the polyline (curve) protrusion structure has higher stiffness which can prevent breakage if a collision does take place. Therefore, the polyline (curve) design of the protrusions can increase the reliability of the protrusions and the diaphragm, and at the same time improve the reliability of the microphone against air pressure.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE DISCLOSURE

Figure 1A:
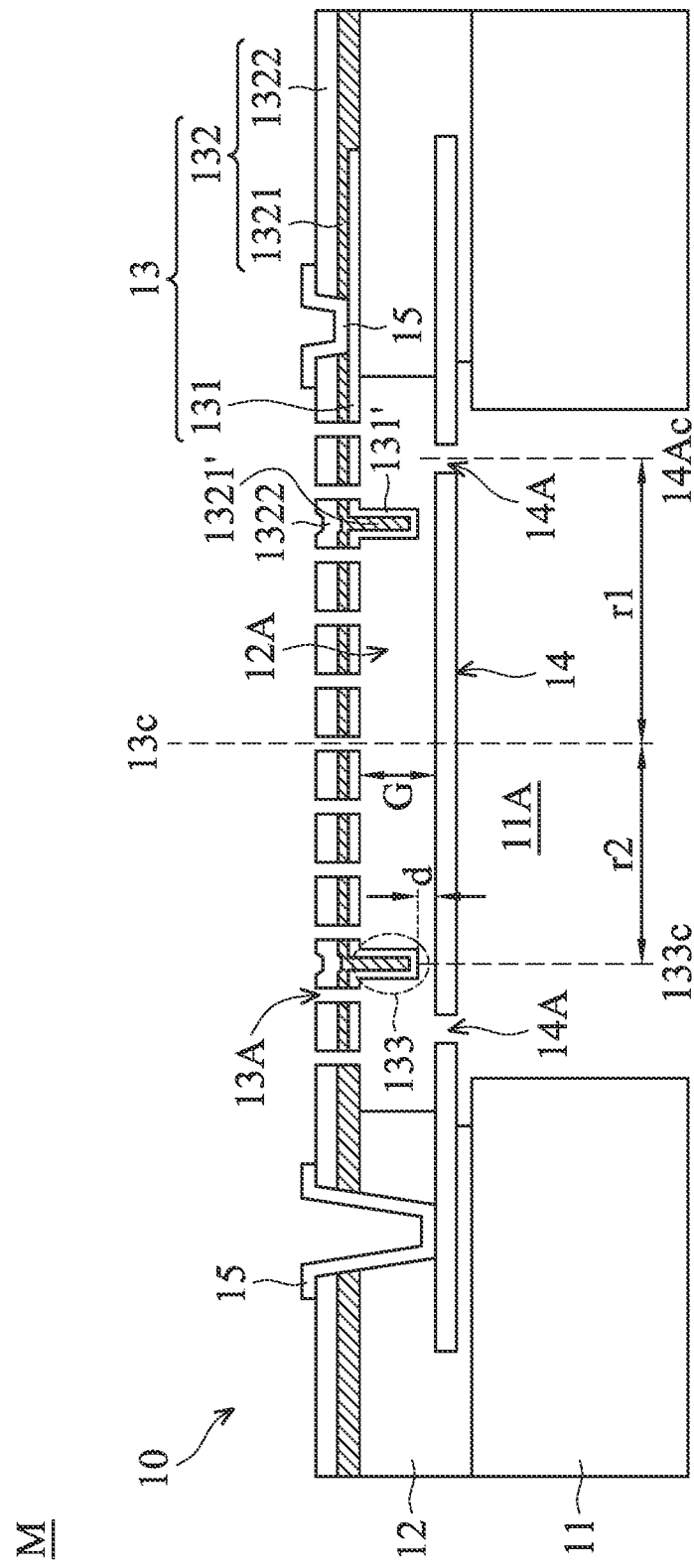
FIG. 1A shows a cross-sectional view of a MEMS microphone in accordance with one embodiment of the present disclosure.

The following description is of the best-contemplated mode of carrying out the disclosure. This description is made for the purpose of illustrating the general principles of the disclosure and should not be taken in a limiting sense. The scope of the disclosure is best determined by reference to the appended claims.

In the following detailed description, the orientations of "on", "above", "under", and "below" are used for representing the relationship between the relative positions of each element as illustrated in the drawings, and are not meant to limit the disclosure. Moreover, the formation of a first element on or above a second element in the description that follows may include embodiments in which the first and second elements are formed in direct contact, or the first and second elements have one or more additional elements formed in between them.

In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity. Furthermore, some elements not shown or described in the embodiments have the forms known by persons skilled in the field of the disclosure.

In the present disclosure, a micro-electro-mechanical system (MEMS) microphone for detecting sound waves and converting the sound waves (acoustic signal) into electric signal is provided, in accordance with various exemplary embodiments. In particular, the MEMS microphones in the various embodiments can achieve high reliable of anti-air pressure via the following described features. The variations of some embodiments are discussed. Throughout the various views and illustrative embodiments, like reference numbers are used to designate like elements.

Figure 1B:
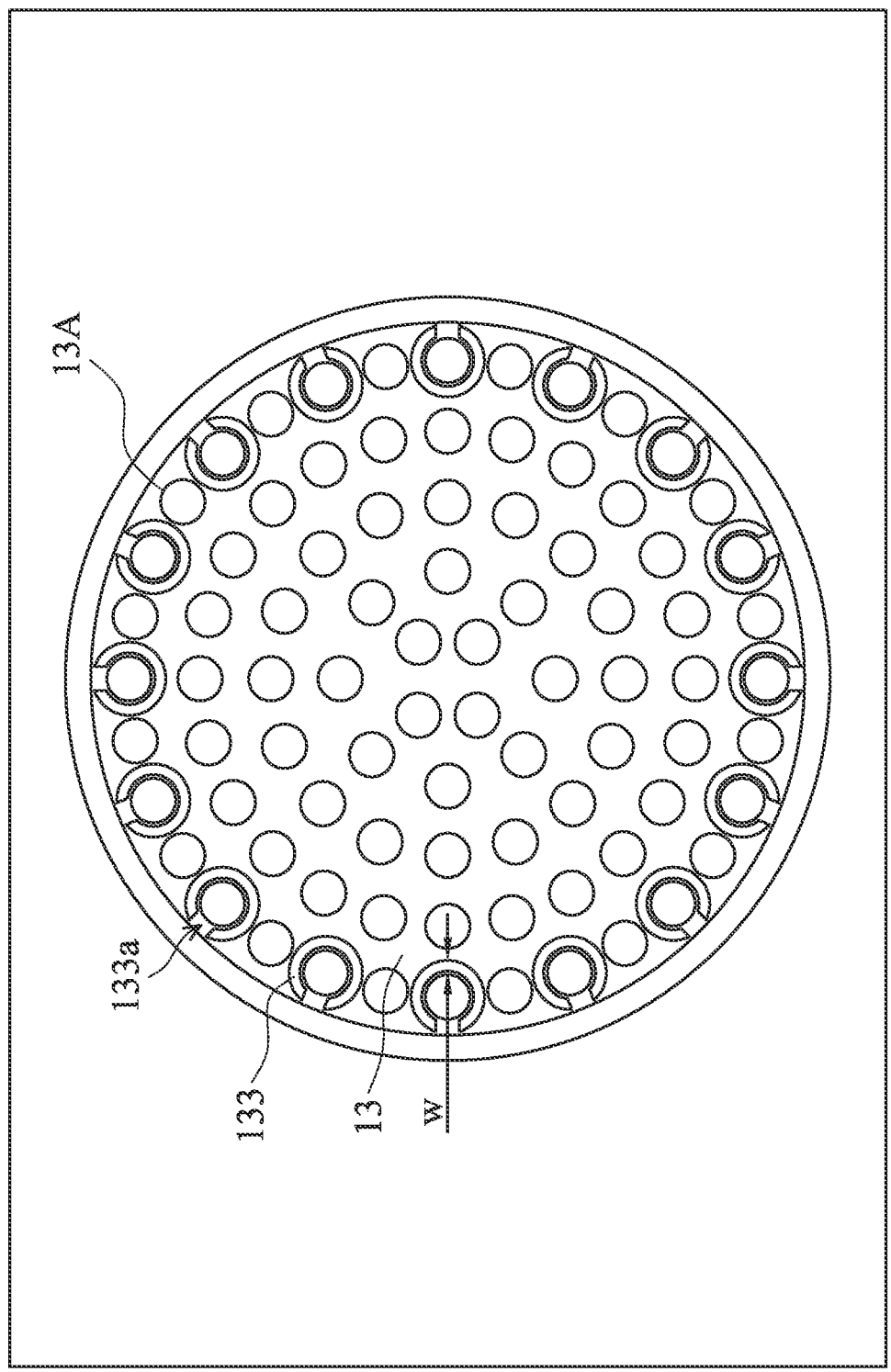
FIG. 1B shows a top view of a MEMS microphone in accordance with one embodiment of the present disclosure.

In accordance with some embodiments of the present disclosure, FIG. 1A shows a cross-sectional view of a micro-electro-mechanical system (MEMS) microphone M. FIG. 1B shows a top view of the MEMS microphone M. It should be noted that the MEMS microphone M depicted in FIGS. 1A and 1B has been simplified for the sake of clarity to better understand the inventive concepts of the present disclosure. In some embodiments, additional features can be added into the MEMS microphone M. In addition, some of the features described below can be replaced or eliminated in other embodiments of the MEMS microphone M. As shown in FIGS. 1A and 1B, the MEMS microphone M is a capacitive microphone. The MEMS microphone M includes a MEMS structure 10 including a substrate 11, a dielectric layer 12, a backplate 13, a diaphragm 14 and an electrode layer 15.

The substrate 11 is configured to support the dielectric layer 12, the backplate 13, the diaphragm 14 and the electrode layer 15 on one side of the substrate 11. The substrate 11 may have an opening portion 11A which allows sound waves received by the MEMS microphone M to pass through and/or enter the MEMS structure 10. The substrate 11 may be made of silicon or the like.

The dielectric layer 12 is disposed between the substrate 11 and the diaphragm 14, and between the diaphragm 14 and the backplate 13 (That is, the diaphragm 14 is inserted in the dielectric layer 12), so as to provide partial isolation between the substrate 11, the diaphragm 14 and the backplate 13 from each other. Moreover, the dielectric layer 12 is disposed around the backplate 13 and the diaphragm 14, such that the backplate 13 and the diaphragm 14 are supported at their edges by the dielectric layer 12. Furthermore, the dielectric layer 12 may have an opening 12A corresponding to the opening 11A of the substrate 11. The sound waves pass through the diaphragm 14 via ventilation holes 14A to reach the opening 12A, and then pass through the backplate 13 via acoustic hole 13A. The dielectric layer 12 may be made of silicon oxide or the like.

The backplate 13 is a stationary element disposed on one side of the substrate 11. The backplate 13 may have sufficient stiffness such that it would not be bending or movable when the sound waves pass through the backplate 13. In some embodiments, the backplate 13 is a stiff perforated element including a number of acoustic holes 13A, each acoustic hole 13A passing through the backplate 13, as shown in FIG. 1A. The acoustic holes 13A are configured to allow the sound waves to pass through.

In some embodiments, the backplate 13 includes a conductive layer 131 and an insulating layer 132 covering the conductive layer 131 for protection. The insulating layer 132 further includes a first insulating layer 1321 and a second insulating layer 1322, such that the conductive layer 131 is disposed on the dielectric layer 12, the first insulating layer 1321 is disposed on the conductive layer 131, and the second insulating layer 1322 is disposed on the first insulating layer 1321, as shown in FIG. 1A. The conductive layer 131 may be made of poly-silicon or the like. The insulating layer 132 (e.g., the first and second insulating layers 1321 and 1322) may be made of silicon nitride or the like. In some embodiments, the first and second insulating layers 1321 and 1322 may be made of the same material or they may be made of different materials.

In some embodiments, the MEMS structure 10 is electrically connected to a circuit (not shown) via several electrode pads of the electrode layer 15 that is disposed on the backplate 13 and electrically connected to the conductive layer 131 and the diaphragm 14. In some embodiments, the electrode layer 15 includes copper, silver, gold, aluminum, or alloy thereof.

The diaphragm 14 is disposed on one side of the substrate 11 and extends across the opening portion 11A of the substrate 11. The diaphragm 14 is movable or displaceable relative to the backplate 13. The diaphragm 14 is configured to sense the sound waves received by the MEMS microphone M.

The displacement change of the diaphragm 14 relative to the backplate 13 causes a capacitance change between the diaphragm 14 and the backplate 13. The capacitance change is then converted into an electric signal by circuitry connected with the diaphragm 14 and the backplate 13, and the electrical signal is sent out of the MEMS microphone M through the electrode layer 15.

On the other hand, in order to increase the sensitivity of the diaphragm 14, a number of ventilation holes 14A may be provided in the diaphragm 14 to reduce the stiffness of the diaphragm 14. In some alternative embodiments, there may be more than two ventilation holes 14A. With this structural feature, high sensitivity of the MEMS microphone M can be achieved. In addition, the ventilation holes 14A in the diaphragm 14 are also configured to relieve the high air pressure on the diaphragm 14.

In some embodiments, an air gap G is formed between the diaphragm 14 and the backplate 13, as shown in FIG. 1A.

Referring to FIG. 1A, the MEMS structure 10 further includes a protrusion 133 extending from the backplate 13 and towards the air gap G. In some embodiments, the protrusion 133 includes a double-layered structure. For example, the protrusion 133 includes an extension portion 1321' of the first insulating layer 1321 and an extension portion 131' of the conductive layer 131 covering the extension portion 1321' of the first insulating layer 1321, as shown in FIG. 1A. The extension portion 131' of the conductive layer 131 can serve as a protective layer of the extension portion 1321' of the first insulating layer 1321 to prevent the extension portion 1321' of the first insulating layer 1321 from being damaged during the etching process.

In some embodiments, the distance between the center 13c of the backplate 13 and the center 14Ac of the ventilation hole 14A is defined as a first distance r1. The distance between the center 13c of the backplate 13 and the center 133c of the protrusion 133 is defined as a second distance r2. The first distance r1 is greater than the second distance r2.

In some embodiments, the distance d between the protrusion 133 and the diaphragm 14 is greater than about 0.1 μm.

Referring to FIG. 1B, the backplate 13 includes a plurality of acoustic holes 13A. In some embodiments, each protrusion 133 surrounds at least one acoustic hole 13A. For example, each protrusion 133 surrounds one acoustic hole 13A, as shown in FIG. 1B, but the present disclosure is not limited thereto. In FIG. 1B, the protrusion 133 surrounds the acoustic hole 13A and forms a curve from a top view. In some embodiments, the protrusion 133 leaves at least one opening for process requirements. For example, the protrusion 133 leaves one opening 133a, as shown in FIG. 1B, but the present disclosure is not limited thereto. In some embodiments, the width w of the protrusion 133 is greater than about 0.5 μm.

Figure 2A:
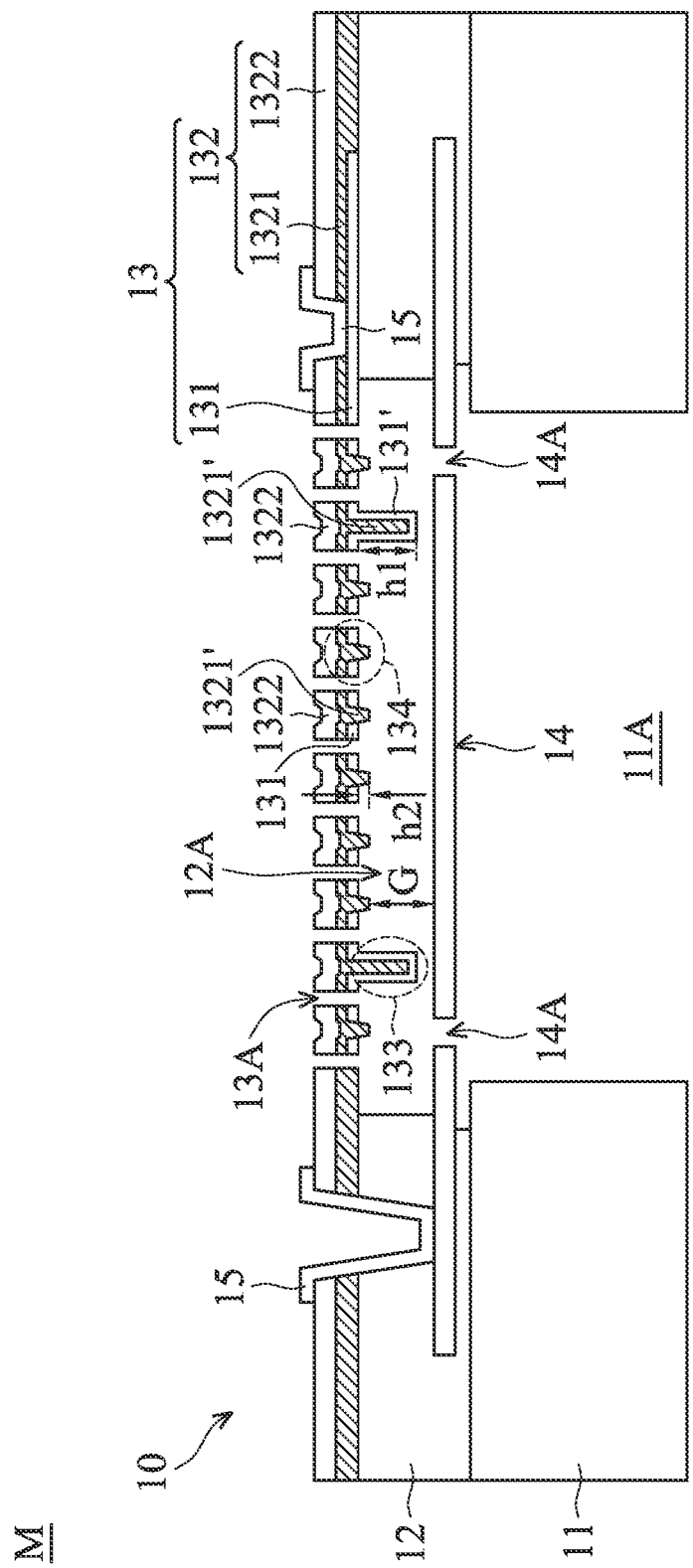
FIG. 2A shows a cross-sectional view of a MEMS microphone in accordance with one embodiment of the present disclosure.
Figure 2B:
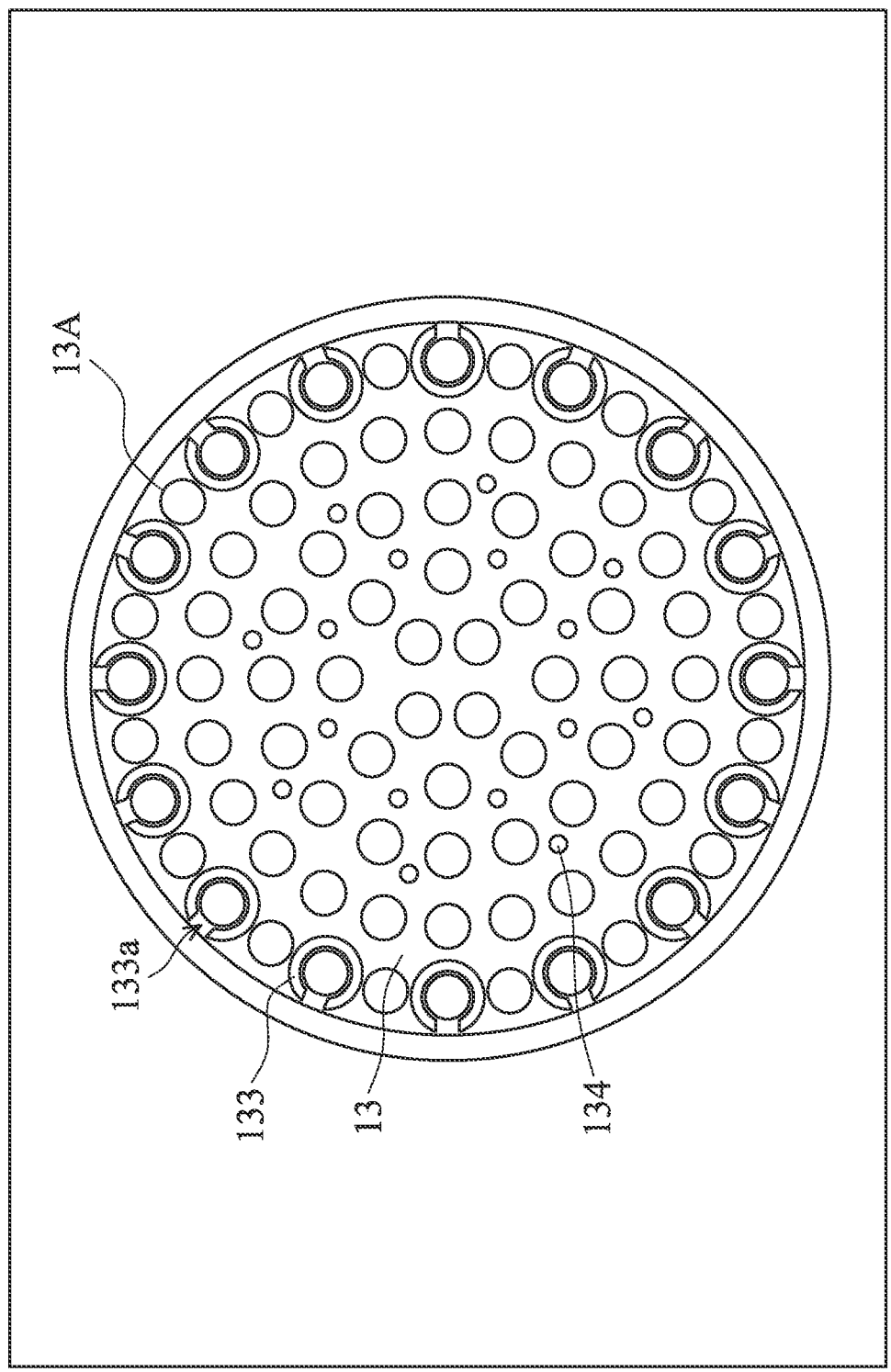
FIG. 2B shows a top view of a MEMS microphone in accordance with one embodiment of the present disclosure.

In accordance with some embodiments of the present disclosure, FIG. 2A shows a cross-sectional view of a micro-electro-mechanical system (MEMS) microphone M. FIG. 2B shows a top view of the MEMS microphone M.

The structure, material and configuration of the MEMS structure 10 shown in FIGS. 2A and 2B are similar to those of the MEMS structure 10 shown in FIGS. 1A and 1B, and will not be repeated here. The main difference from FIGS. 1A and 1B is the configuration of the additional protrusion structures.

Referring to FIG. 2A, the MEMS structure 10 includes a first protrusion 133 and a second protrusion 134 which extend from the backplate 13 and towards the air gap G. In some embodiments, the first protrusion 133 includes a double-layered structure. For example, the first protrusion 133 includes an extension portion 1321' of the first insulating layer 1321 and an extension portion 131' of the conductive layer 131 covering the extension portion 1321' of the first insulating layer 1321, as shown in FIG. 2A. The extension portion 131' of the conductive layer 131 can serve as a protective layer of the extension portion 1321' of the first insulating layer 1321 to prevent the extension portion 1321' of the first insulating layer 1321 from being damaged during the etching process. In some embodiments, the second protrusion 134 includes a single-layer structure. For example, the second protrusion 134 includes an extension portion 1321' of the first insulating layer 1321. Specifically, the height "h2" of the second protrusion 134 is lower than the height "h1" of the first protrusion 133, as shown in FIG. 2A. The second protrusion 134 can prevent the backplate 13 from sticking to the diaphragm 14. In addition, in FIG. 2A, the air gap G is formed between the diaphragm 14 and each second protrusion 134. In some embodiments, the air gap G between the diaphragm 14 and each second protrusion 134 may be the same, but the present disclosure is not limited thereto.

Referring to FIG. 2B, the backplate 13 includes a plurality of acoustic holes 13A. In some embodiments, each first protrusion 133 surrounds at least one acoustic hole 13A. For example, each first protrusion 133 surrounds one acoustic hole 13A, as shown in FIG. 2B, but the present disclosure is not limited thereto. In FIG. 2B, the first protrusion 133 surrounds the acoustic hole 13A and forms a curve from a top view. In some embodiments, the first protrusion 133 leaves at least one opening for process requirements. For example, the first protrusion 133 leaves one opening 133a, as shown in FIG. 2B, but the present disclosure is not limited thereto. In FIG. 2B, the second protrusions 134 are distributed on the backplate 13.

Figure 3A:
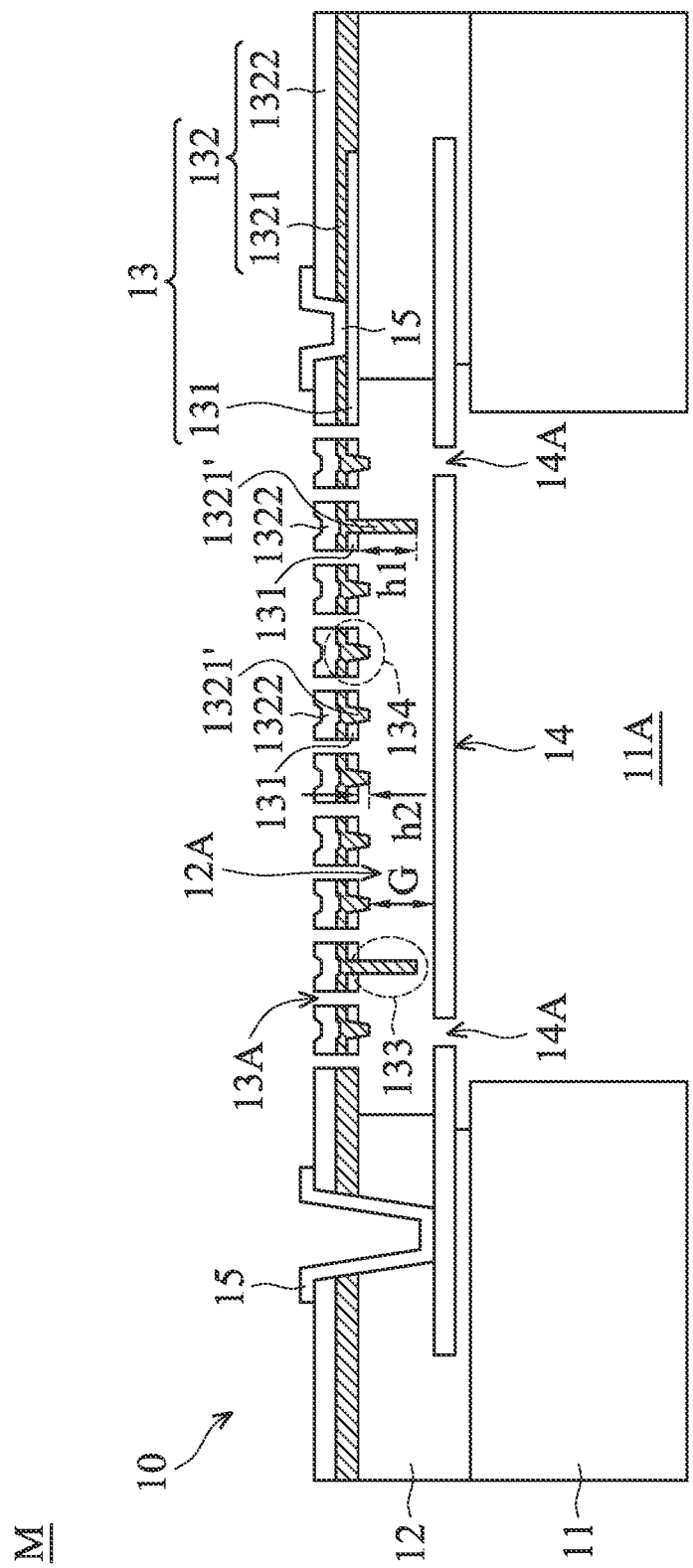
FIG. 3A shows a cross-sectional view of a MEMS microphone in accordance with one embodiment of the present disclosure.
Figure 3B:
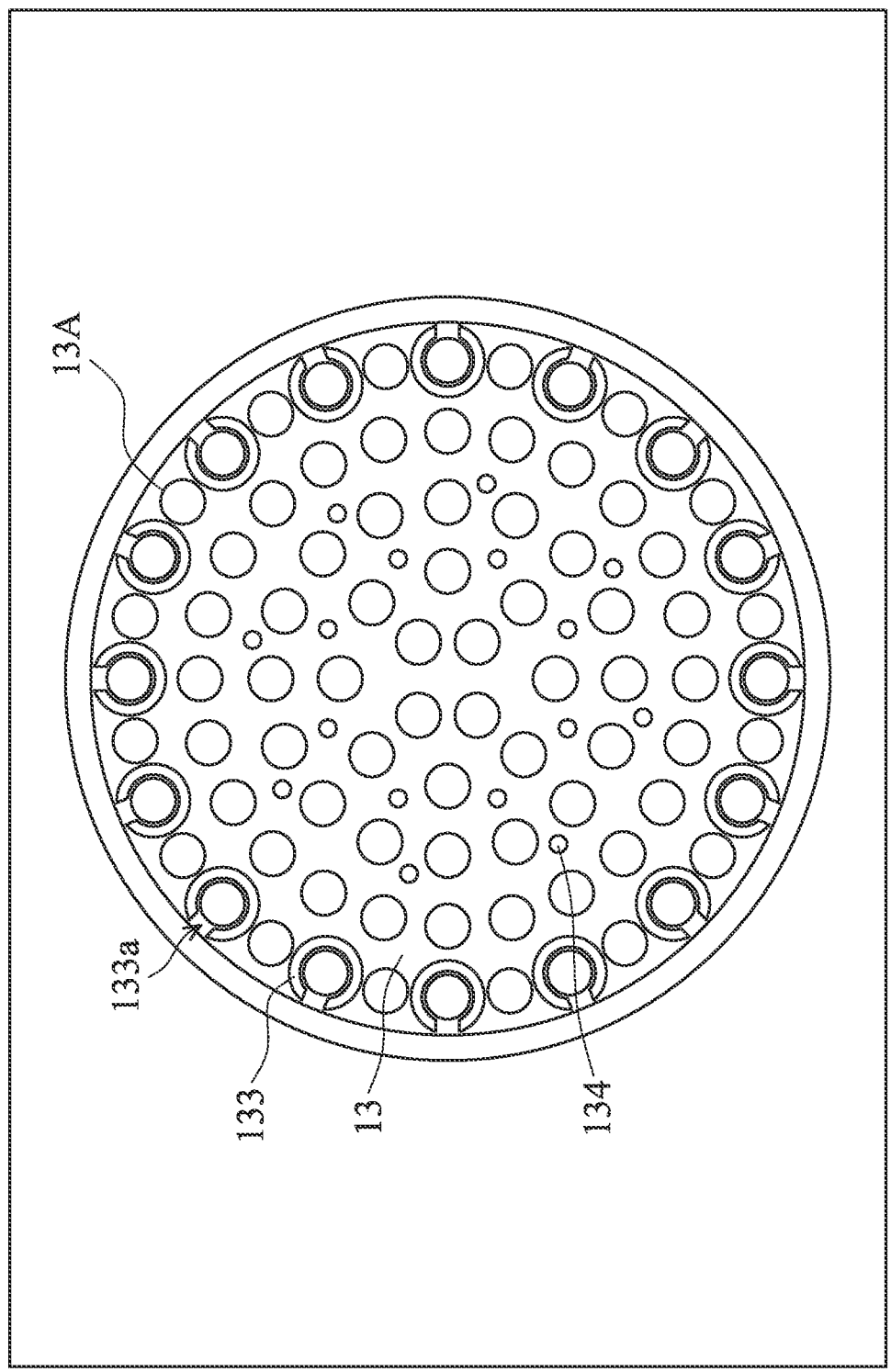
FIG. 3B shows a top view of a MEMS microphone in accordance with one embodiment of the present disclosure.

In accordance with some embodiments of the present disclosure, FIG. 3A shows a cross-sectional view of a micro-electro-mechanical system (MEMS) microphone M. FIG. 3B shows a top view of the MEMS microphone M.

The structure, material and configuration of the MEMS structure 10 shown in FIGS. 3A and 3B are similar to those of the MEMS structure 10 shown in FIGS. 2A and 2B, and will not be repeated here. The main difference from FIGS. 2A and 2B is the composition of the protrusion structures.

Referring to FIG. 3A, the MEMS structure 10 includes a first protrusion 133 and a second protrusion 134 which extend from the backplate 13 and towards the air gap G. In some embodiments, the first protrusion 133 includes a single-layer structure. For example, the first protrusion 133 includes an extension portion 1321' of the first insulating layer 1321, as shown in FIG. 3A. In some embodiments, the second protrusion 134 includes a single-layer structure. For example, the second protrusion 134 includes an extension portion 1321' of the first insulating layer 1321. Specifically, the height "h2" of the second protrusion 134 is lower than the height "h1" of the first protrusion 133, as shown in FIG. 3A. The second protrusion 134 can prevent the backplate 13 from sticking to the diaphragm 14. In addition, in FIG. 3A, the air gap G is formed between the diaphragm 14 and each second protrusion 134. In some embodiments, the air gap G between the diaphragm 14 and each second protrusion 134 may be the same, but the present disclosure is not limited thereto.

Figure 4A:
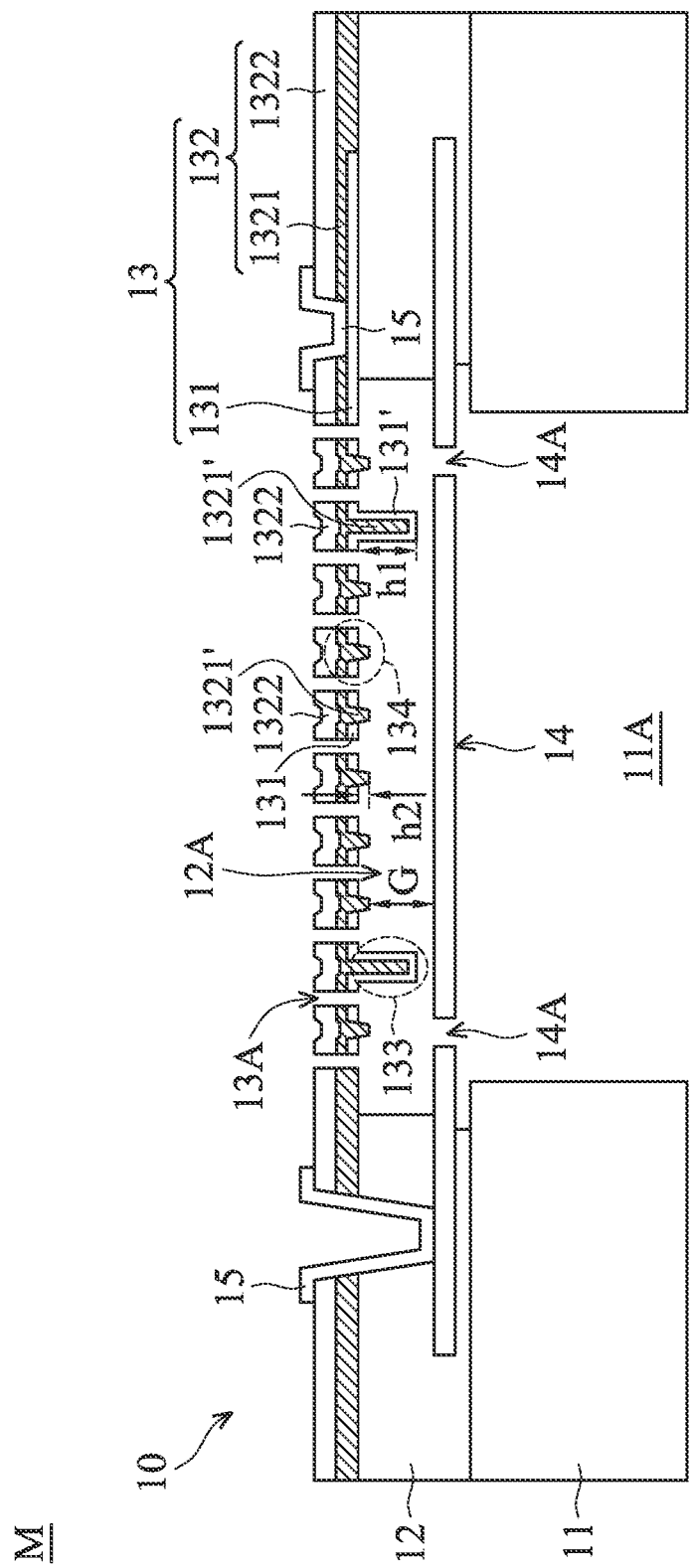
FIG. 4A shows a cross-sectional view of a MEMS microphone in accordance with one embodiment of the present disclosure.
Figure 4B:
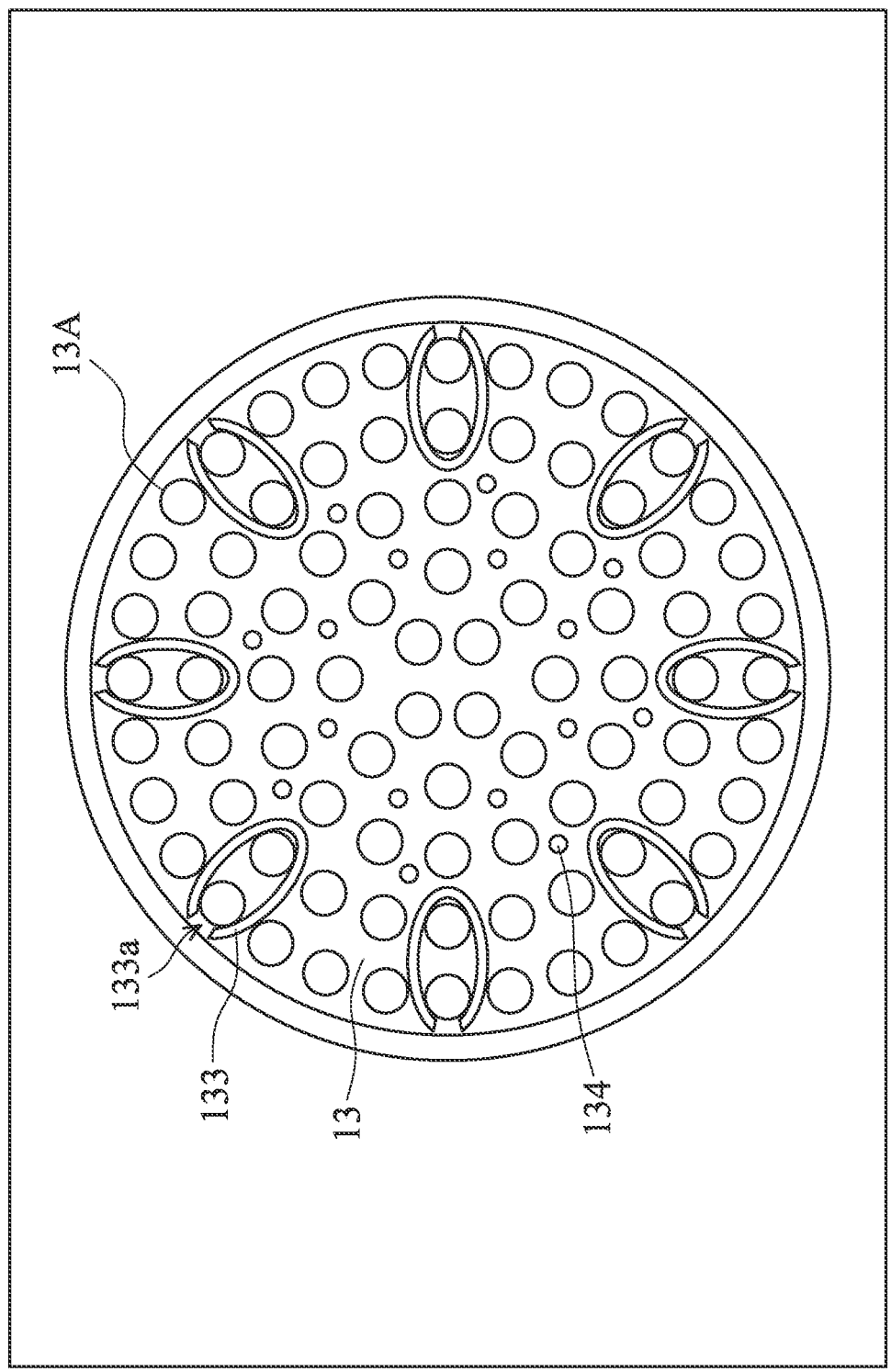
FIG. 4B shows a top view of a MEMS microphone in accordance with one embodiment of the present disclosure.

In accordance with some embodiments of the present disclosure, FIG. 4A shows a cross-sectional view of a micro-electro-mechanical system (MEMS) microphone M. FIG. 4B shows a top view of the MEMS microphone M.

The structure, material and configuration of the MEMS structure 10 shown in FIGS. 4A and 4B are similar to those of the MEMS structure 10 shown in FIGS. 2A and 2B, and will not be repeated here. The main difference from FIGS. 2A and 2B is the configuration of the protrusion structures.

The MEMS structure 10 shown in FIG. 4A is similar to that shown in FIG. 2A, and will not be repeated here.

Referring to FIG. 4B, the backplate 13 includes a plurality of acoustic holes 13A. In some embodiments, each first protrusion 133 surrounds at least one acoustic hole 13A. For example, each first protrusion 133 surrounds two acoustic holes 13A, as shown in FIG. 4B, but the present disclosure is not limited thereto. When each first protrusion 133 surrounds more acoustic holes 13A, the first protrusion 133 and the diaphragm 14 will have a larger contact area to limit the deformation of the diaphragm 14. In FIG. 4B, the first protrusion 133 surrounds the acoustic holes 13A and forms a curve from a top view. In some embodiments, the first protrusion 133 leaves at least one opening for process requirements. For example, the first protrusion 133 leaves one opening 133a, as shown in FIG. 4B, but the present disclosure is not limited thereto. In FIG. 4B, the second protrusions 134 are randomly distributed on the backplate 13.

Figure 5A:
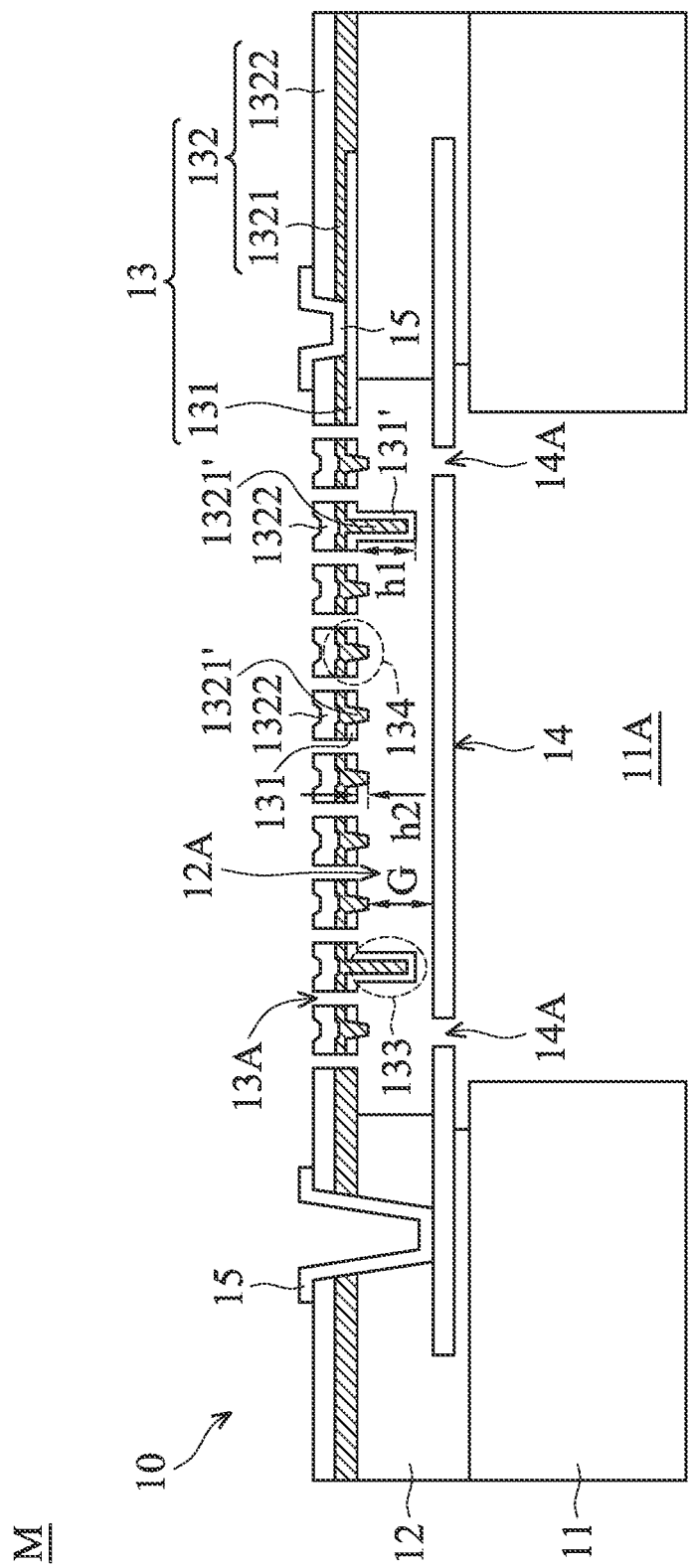
FIG. 5A shows a cross-sectional view of a MEMS microphone in accordance with one embodiment of the present disclosure.
Figure 5B:
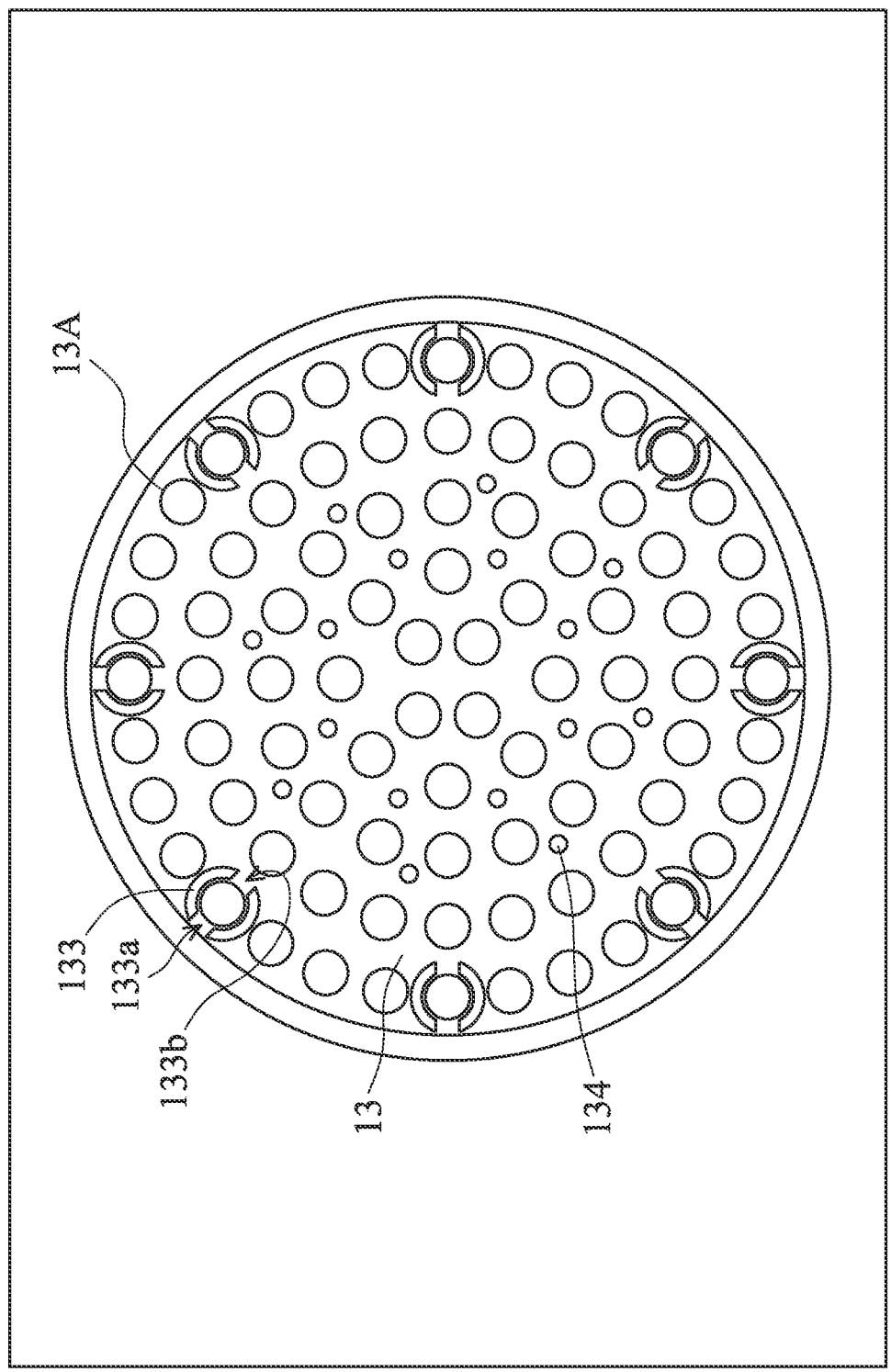
FIG. 5B shows a top view of a MEMS microphone in accordance with one embodiment of the present disclosure.

In accordance with some embodiments of the present disclosure, FIG. 5A shows a cross-sectional view of a micro-electro-mechanical system (MEMS) microphone M. FIG. 5B shows a top view of the MEMS microphone M.

The structure, material and configuration of the MEMS structure 10 shown in FIGS. 5A and 5B are similar to those of the MEMS structure 10 shown in FIGS. 2A and 2B, and will not be repeated here. The main difference from FIGS. 2A and 2B is the configuration of the protrusion structures.

The MEMS structure 10 shown in FIG. 5A is similar to that shown in FIG. 2A, and will not be repeated here.

Referring to FIG. 5B, the backplate 13 includes a plurality of acoustic holes 13A. In some embodiments, each first protrusion 133 surrounds at least one acoustic hole 13A. For example, each first protrusion 133 surrounds one acoustic hole 13A, as shown in FIG. 5B, but the present disclosure is not limited thereto. In FIG. 5B, the first protrusion 133 surrounds the acoustic hole 13A and forms a curve from a top view. In some embodiments, the first protrusion 133 leaves at least one opening for process requirements. For example, the first protrusion 133 leaves two openings (133a and 133b), as shown in FIG. 5B, but the present disclosure is not limited thereto. In FIG. 5B, the second protrusions 134 are distributed on the backplate 13.

Figure 6A:
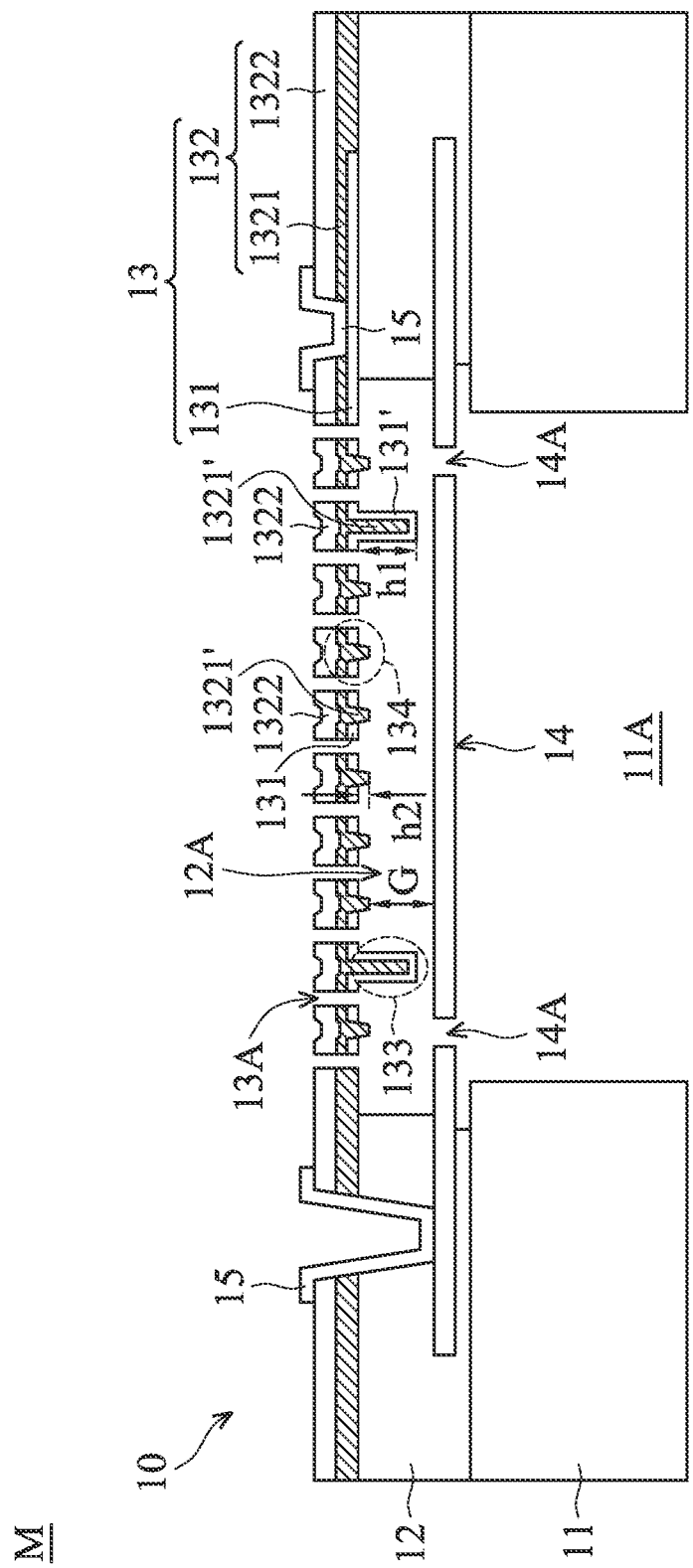
FIG. 6A shows a cross-sectional view of a MEMS microphone in accordance with one embodiment of the present disclosure.
Figure 6B:
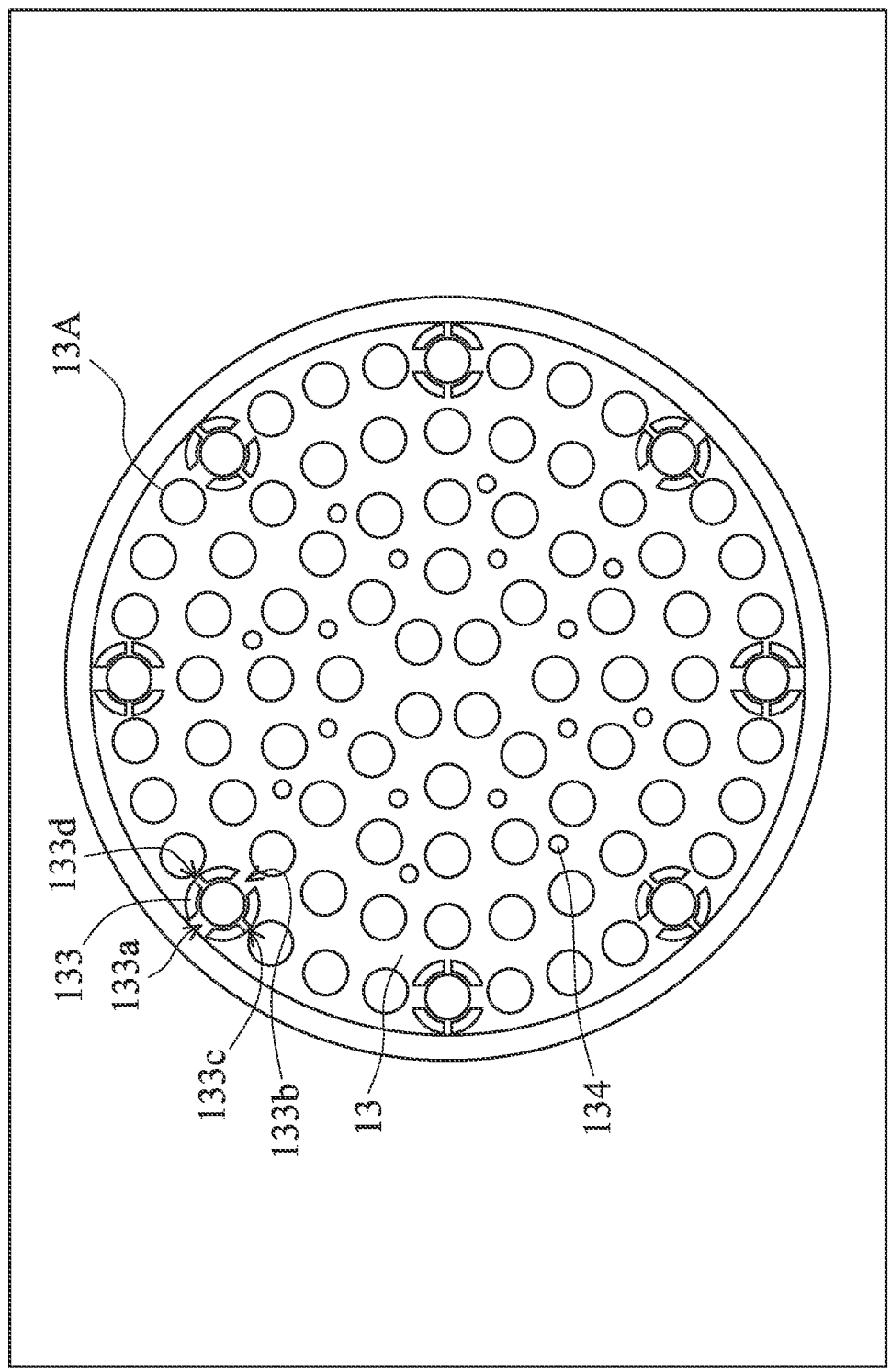
FIG. 6B shows a top view of a MEMS microphone in accordance with one embodiment of the present disclosure.

In accordance with some embodiments of the present disclosure, FIG. 6A shows a cross-sectional view of a micro-electro-mechanical system (MEMS) microphone M. FIG. 6B shows a top view of the MEMS microphone M.

The structure, material and configuration of the MEMS structure 10 shown in FIGS. 6A and 6B are similar to those of the MEMS structure 10 shown in FIGS. 2A and 2B, and will not be repeated here. The main difference from FIGS. 2A and 2B is the configuration of the protrusion structures.

The MEMS structure 10 shown in FIG. 6A is similar to that shown in FIG. 2A, and will not be repeated here.

Referring to FIG. 6B, the backplate 13 includes a plurality of acoustic holes 13A. In some embodiments, each first protrusion 133 surrounds at least one acoustic hole 13A. For example, each first protrusion 133 surrounds one acoustic hole 13A, as shown in FIG. 6B, but the present disclosure is not limited thereto. In FIG. 6B, the first protrusion 133 surrounds the acoustic hole 13A and forms a curve from a top view. In some embodiments, the first protrusion 133 leaves at least one opening for process requirements. For example, the first protrusion 133 leaves four openings (133a, 133b, 133c and 133d), as shown in FIG. 6B, but the present disclosure is not limited thereto. In FIG. 6B, the second protrusions 134 are randomly distributed on the backplate 13.

Figure 7A:
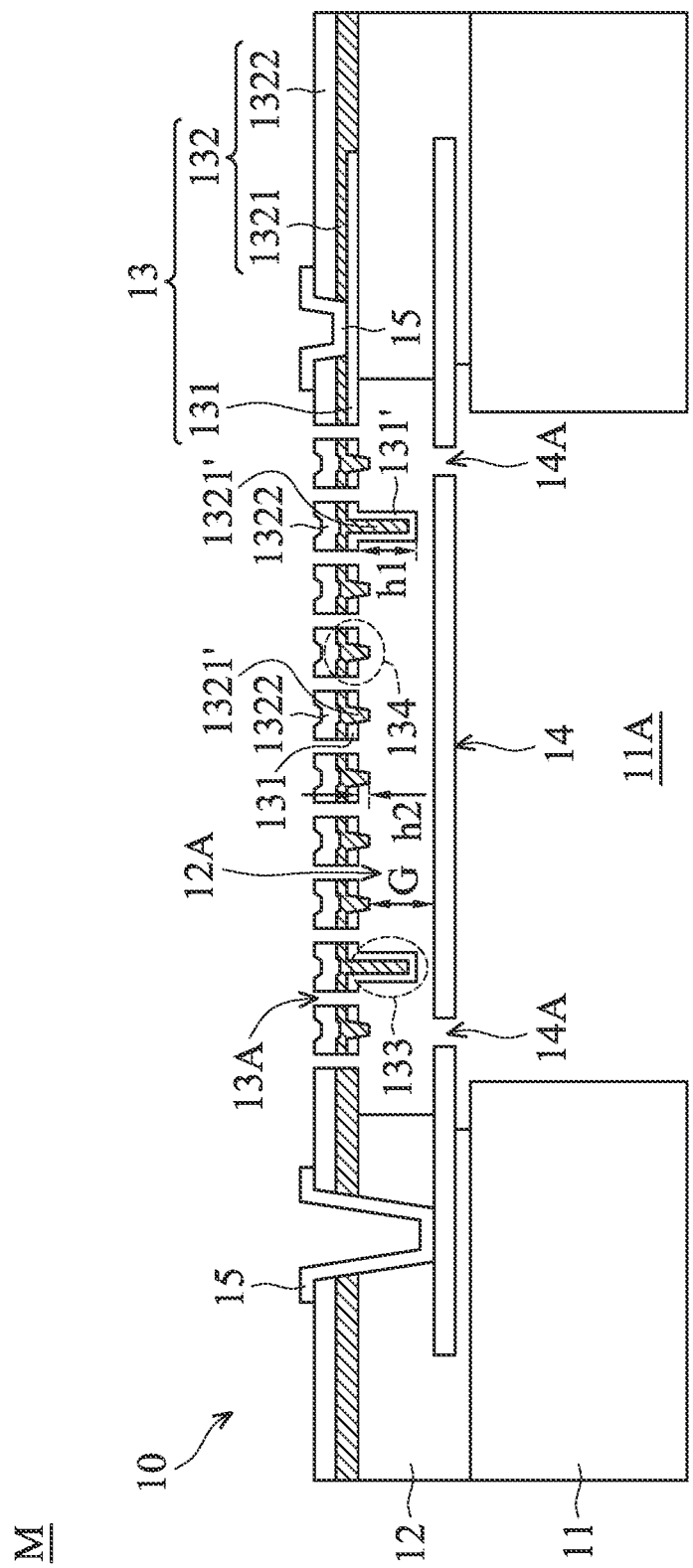
FIG. 7A shows a cross-sectional view of a MEMS microphone in accordance with one embodiment of the present disclosure.
Figure 7B:
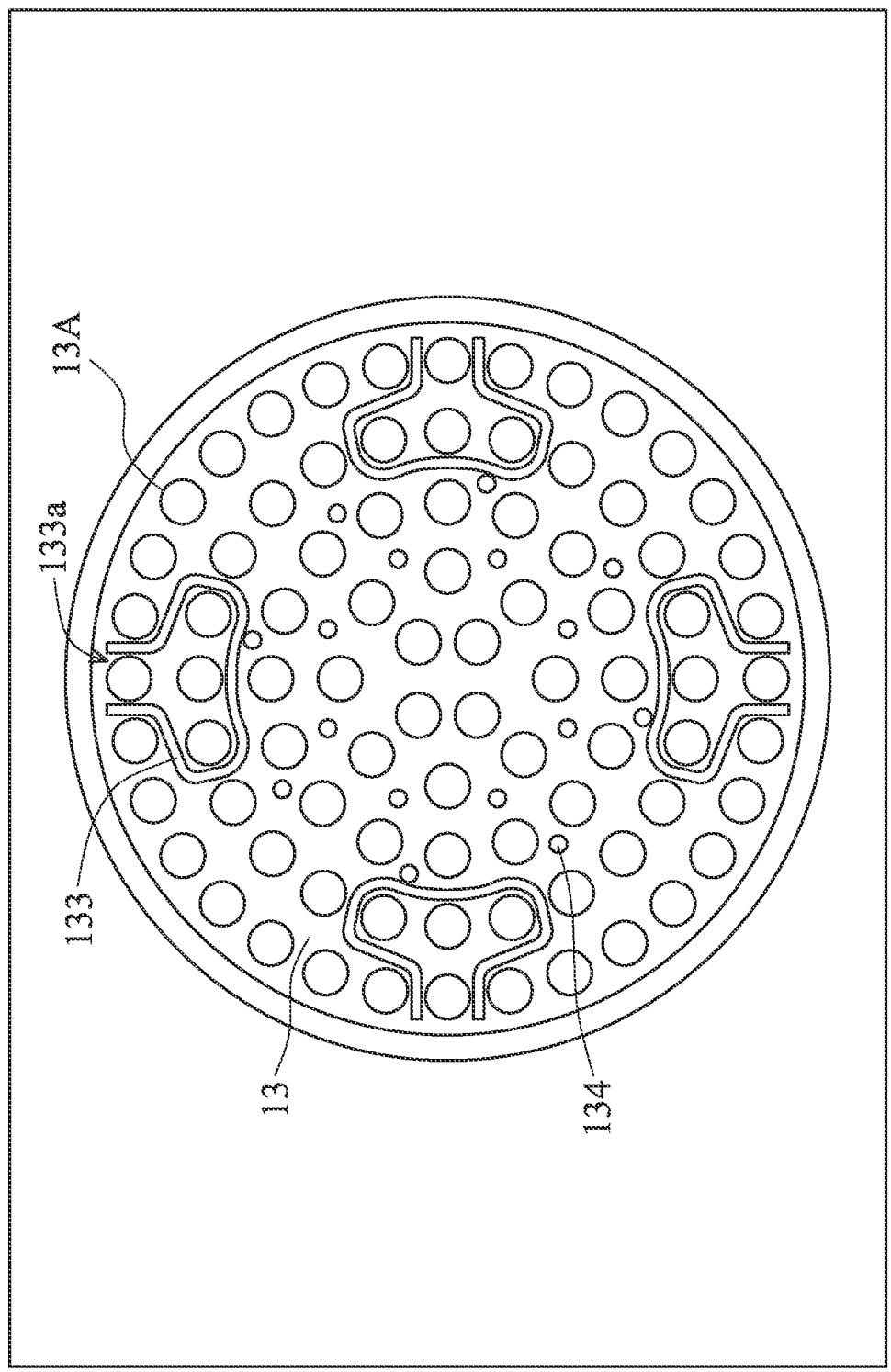
FIG. 7B shows a top view of a MEMS microphone in accordance with one embodiment of the present disclosure.

In accordance with some embodiments of the present disclosure, FIG. 7A shows a cross-sectional view of a micro-electro-mechanical system (MEMS) microphone M. FIG. 7B shows a top view of the MEMS microphone M.

The structure, material and configuration of the MEMS structure 10 shown in FIGS. 7A and 7B are similar to those of the MEMS structure 10 shown in FIGS. 2A and 2B, and will not be repeated here. The main difference from FIGS. 2A and 2B is the configuration of the protrusion structures.

The MEMS structure 10 shown in FIG. 7A is similar to that shown in FIG. 2A, and will not be repeated here.

Referring to FIG. 7B, the backplate 13 includes a plurality of acoustic holes 13A. In some embodiments, each first protrusion 133 surrounds at least one acoustic hole 13A. For example, each first protrusion 133 surrounds four acoustic holes 13A, as shown in FIG. 7B, but the present disclosure is not limited thereto. In FIG. 7B, the first protrusion 133 surrounds the acoustic holes 13A and forms a polyline from a top view. In some embodiments, the first protrusion 133 leaves at least one opening for process requirements. For example, the first protrusion 133 leaves one opening 133a, as shown in FIG. 7B, but the present disclosure is not limited thereto. In FIG. 7B, the second protrusions 134 are randomly distributed on the backplate 13.

Figure 8A:
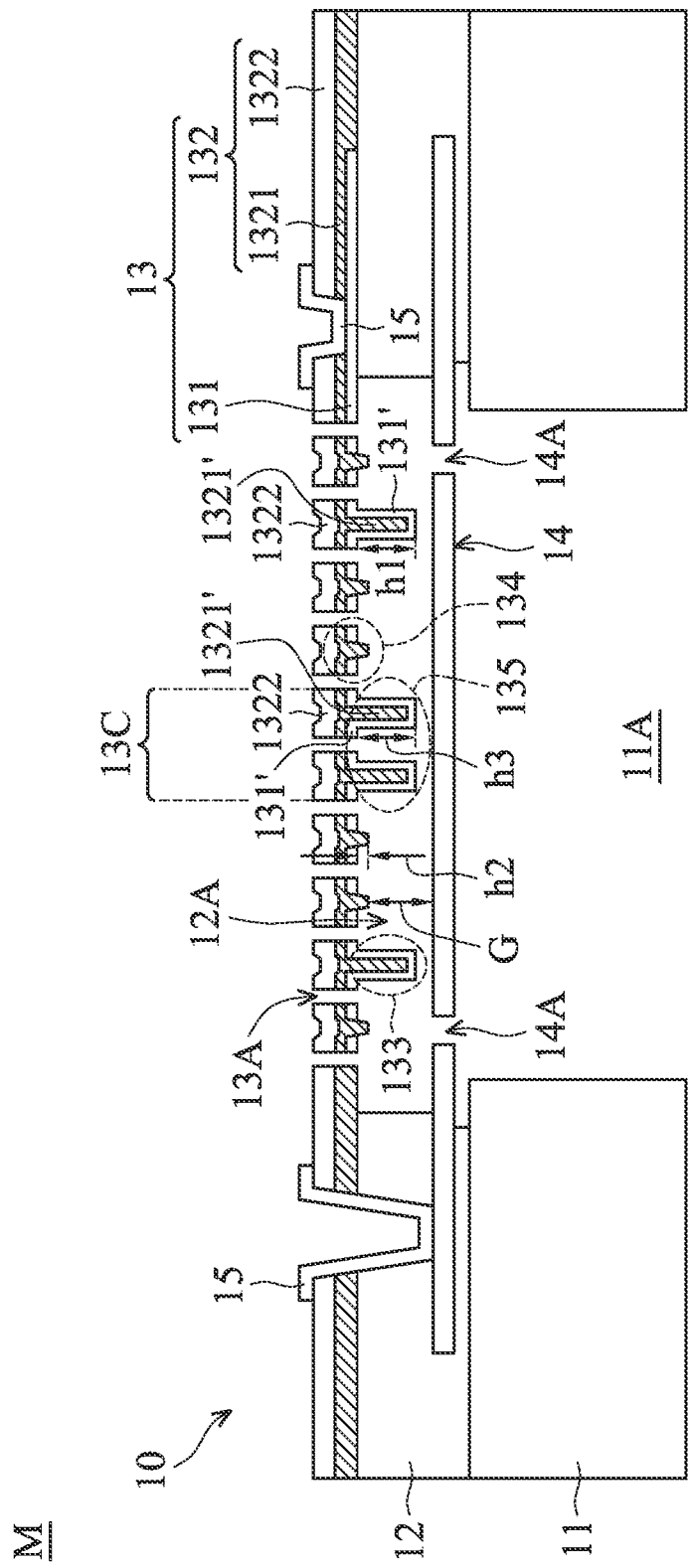
FIG. 8A shows a cross-sectional view of a MEMS microphone in accordance with one embodiment of the present disclosure.
Figure 8B:
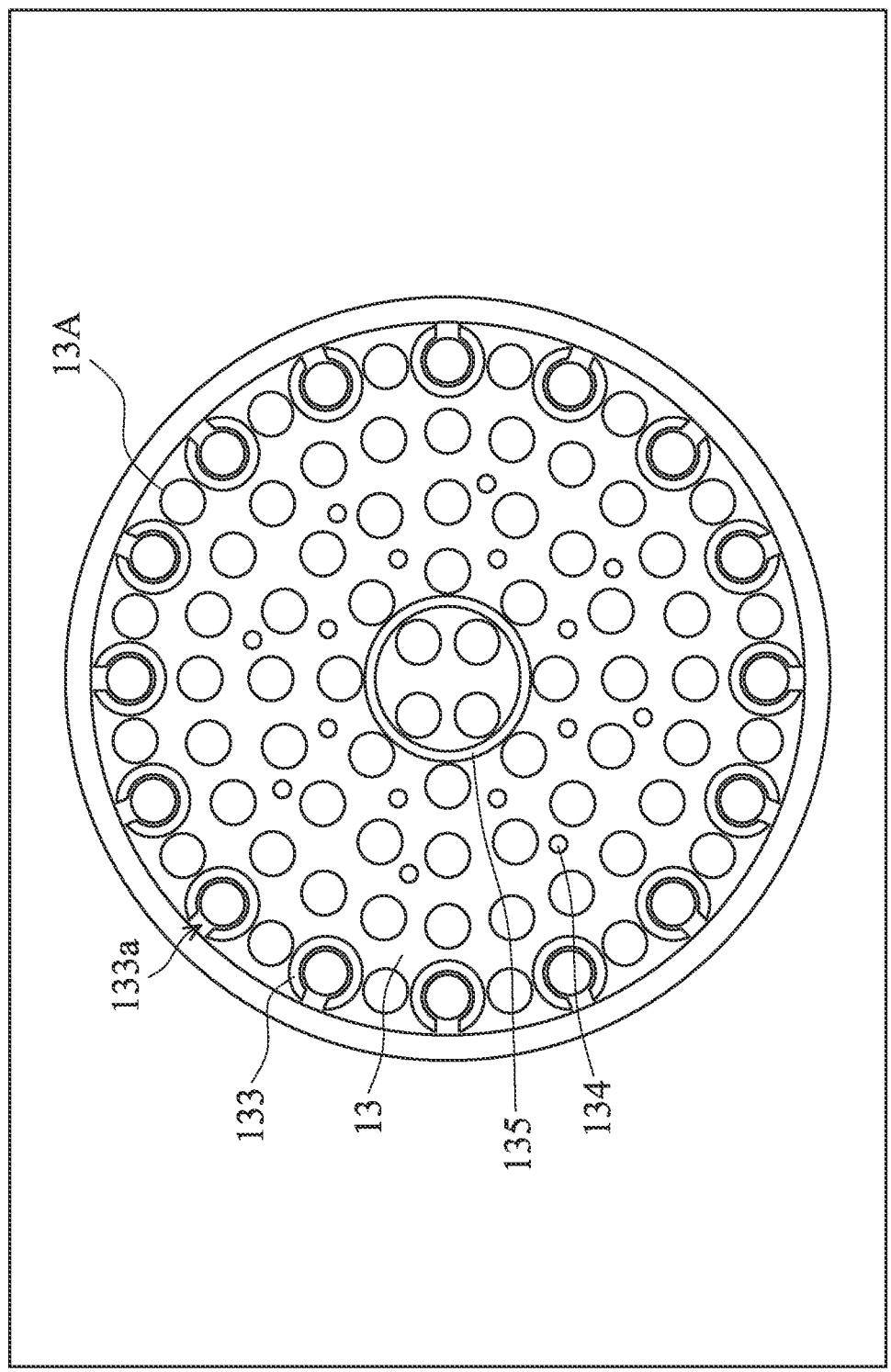
FIG. 8B shows a top view of a MEMS microphone in accordance with one embodiment of the present disclosure.

In accordance with some embodiments of the present disclosure, FIG. 8A shows a cross-sectional view of a micro-electro-mechanical system (MEMS) microphone M. FIG. 8B shows a top view of the MEMS microphone M.

The structure, material and configuration of the MEMS structure 10 shown in FIGS. 8A and 8B are similar to those of the MEMS structure 10 shown in FIGS. 2A and 2B, and will not be repeated here. The main difference from FIGS. 2A and 2B is the configuration of the protrusion structures.

Referring to FIG. 8A, the MEMS structure 10 includes a first protrusion 133, a second protrusion 134 and a third protrusion 135 which extend from the backplate 13 and towards the air gap G. The third protrusion 135 is located between the second protrusions 134. In some embodiments, the third protrusion 135 is located on the center 13c of the backplate 13. In some embodiments, each of the first protrusion 133 and the third protrusion 135 includes a double-layered structure. For example, each of the first protrusion 133 and the third protrusion 135 includes an extension portion 1321' of the first insulating layer 1321 and an extension portion 131' of the conductive layer 131 covering the extension portion 1321' of the first insulating layer 1321, as shown in FIG. 8A. The extension portion 131' of the conductive layer 131 can serve as a protective layer of the extension portion 1321' of the first insulating layer 1321 to prevent the extension portion 1321' of the first insulating layer 1321 from being damaged during the etching process. In some embodiments, the second protrusion 134 includes a single-layer structure. For example, the second protrusion 134 includes an extension portion 1321' of the first insulating layer 1321. Specifically, the height "h2" of the second protrusion 134 is lower than the height "h1" of the first protrusion 133 and the height "h3" of the third protrusion 135, and the height "h3" of the third protrusion 135 is similar to the height "h1" of the first protrusion 133, as shown in FIG. 8A. The second protrusion 134 can prevent the backplate 13 from sticking to the diaphragm 14. In addition, in FIG. 8A, the air gap G is formed between the diaphragm 14 and each second protrusion 134. In some embodiments, the air gap G between the diaphragm 14 and each second protrusion 134 may be the same, but the present disclosure is not limited thereto.

Referring to FIG. 8B, the backplate 13 includes a plurality of acoustic holes 13A. In some embodiments, each first protrusion 133 surrounds at least one acoustic hole 13A. For example, each first protrusion 133 surrounds one acoustic hole 13A, as shown in FIG. 8B, but the present disclosure is not limited thereto. In FIG. 8B, the first protrusion 133 surrounds the acoustic hole 13A and forms a curve from a top view. In some embodiments, the first protrusion 133 leaves at least one opening for process requirements. For example, the first protrusion 133 leaves one opening 133a, as shown in FIG. 8B, but the present disclosure is not limited thereto. In FIG. 8B, the second protrusions 134 are randomly distributed on the backplate 13. In some embodiments, the third protrusion 135 surrounds at least one acoustic hole 13A. For example, the third protrusion 135 surrounds four acoustic holes 13A, as shown in FIG. 8B, but the present disclosure is not limited thereto. In FIG. 8B, the third protrusion 135 surrounds the acoustic holes 13A and forms a closed ring from a top view, but the present disclosure is not limited thereto. In some embodiments, the third protrusion forms a polyline from a top view.

Figure 9A:
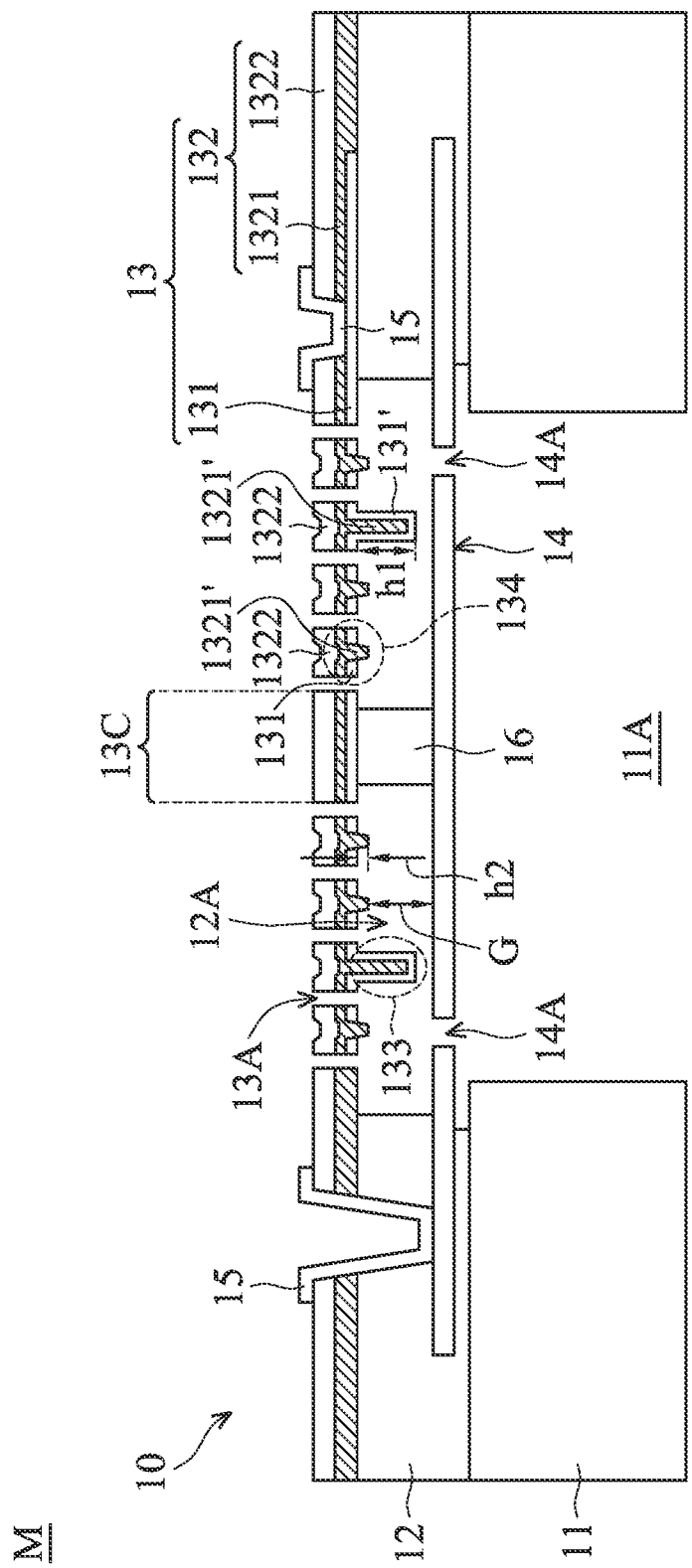
FIG. 9A shows a cross-sectional view of a MEMS microphone in accordance with one embodiment of the present disclosure.
Figure 9B:
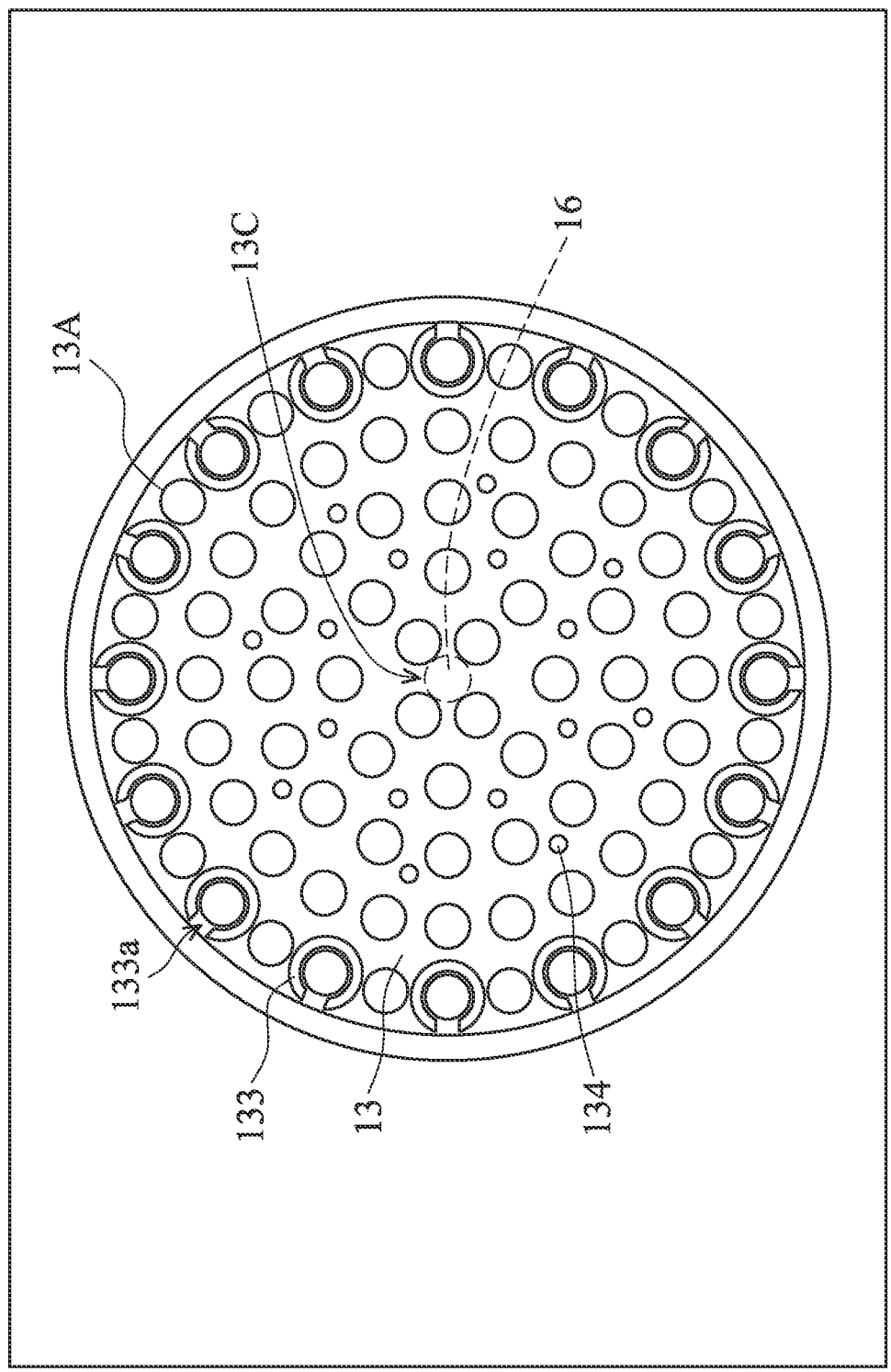
FIG. 9B shows a top view of a MEMS microphone in accordance with one embodiment of the present disclosure.

In accordance with some embodiments of the present disclosure, FIG. 9A shows a cross-sectional view of a micro-electro-mechanical system (MEMS) microphone M. FIG. 9B shows a top view of the MEMS microphone M.

The structure, material and configuration of the MEMS structure 10 shown in FIGS. 9A and 9B are similar to those of the MEMS structure 10 shown in FIGS. 2A and 2B, and will not be repeated here. The main difference from FIGS. 2A and 2B is the configuration of other protrusion structures.

Referring to FIG. 9A, the MEMS structure 10 includes a first protrusion 133 and a second protrusion 134 which extend from the backplate 13 and towards the air gap G. In some embodiments, the first protrusion 133 includes a double-layered structure. For example, the first protrusion 133 includes an extension portion 1321' of the first insulating layer 1321 and an extension portion 131' of the conductive layer 131 covering the extension portion 1321' of the first insulating layer 1321, as shown in FIG. 9A. The extension portion 131' of the conductive layer 131 can serve as a protective layer of the extension portion 1321' of the first insulating layer 1321 to prevent the extension portion 1321' of the first insulating layer 1321 from being damaged during the etching process. In some embodiments, the second protrusion 134 includes a single-layer structure. For example, the second protrusion 134 includes an extension portion 1321' of the first insulating layer 1321. Specifically, the height "h2" of the second protrusion 134 is lower than the height "h1" of the first protrusion 133, as shown in FIG. 9A. The second protrusion 134 can prevent the backplate 13 from sticking to the diaphragm 14. In FIG. 9A, the air gap G is formed between the diaphragm 14 and each second protrusion 134. In some embodiments, the air gap G between the diaphragm 14 and each second protrusion 134 may be the same, but the present disclosure is not limited thereto. In addition, the MEMS structure 10 further includes a pillar 16 disposed on the backplate 13. In some embodiments, the pillar 16 is located between the second protrusions 134. In some embodiments, the pillar 16 is disposed on the center 13c of the backplate 13, and it is in contact with the diaphragm 14. In some embodiments, the pillar 16 may include insulating material. For example, the pillar 16 may be made of silicon oxide or the like.

Referring to FIG. 9B, the backplate 13 includes a plurality of acoustic holes 13A. In some embodiments, each first protrusion 133 surrounds at least one acoustic hole 13A. For example, each first protrusion 133 surrounds one acoustic hole 13A, as shown in FIG. 9B, but the present disclosure is not limited thereto. In FIG. 9B, the first protrusion 133 surrounds the acoustic hole 13A and forms a curve from a top view. In some embodiments, the first protrusion 133 leaves at least one opening for process requirements. For example, the first protrusion 133 leaves one opening 133a, as shown in FIG. 9B, but the present disclosure is not limited thereto. In FIG. 9B, the second protrusions 134 are randomly distributed on the backplate 13. The pillar 16 is located on the center 13c of the backplate 13.

Figure 9C:
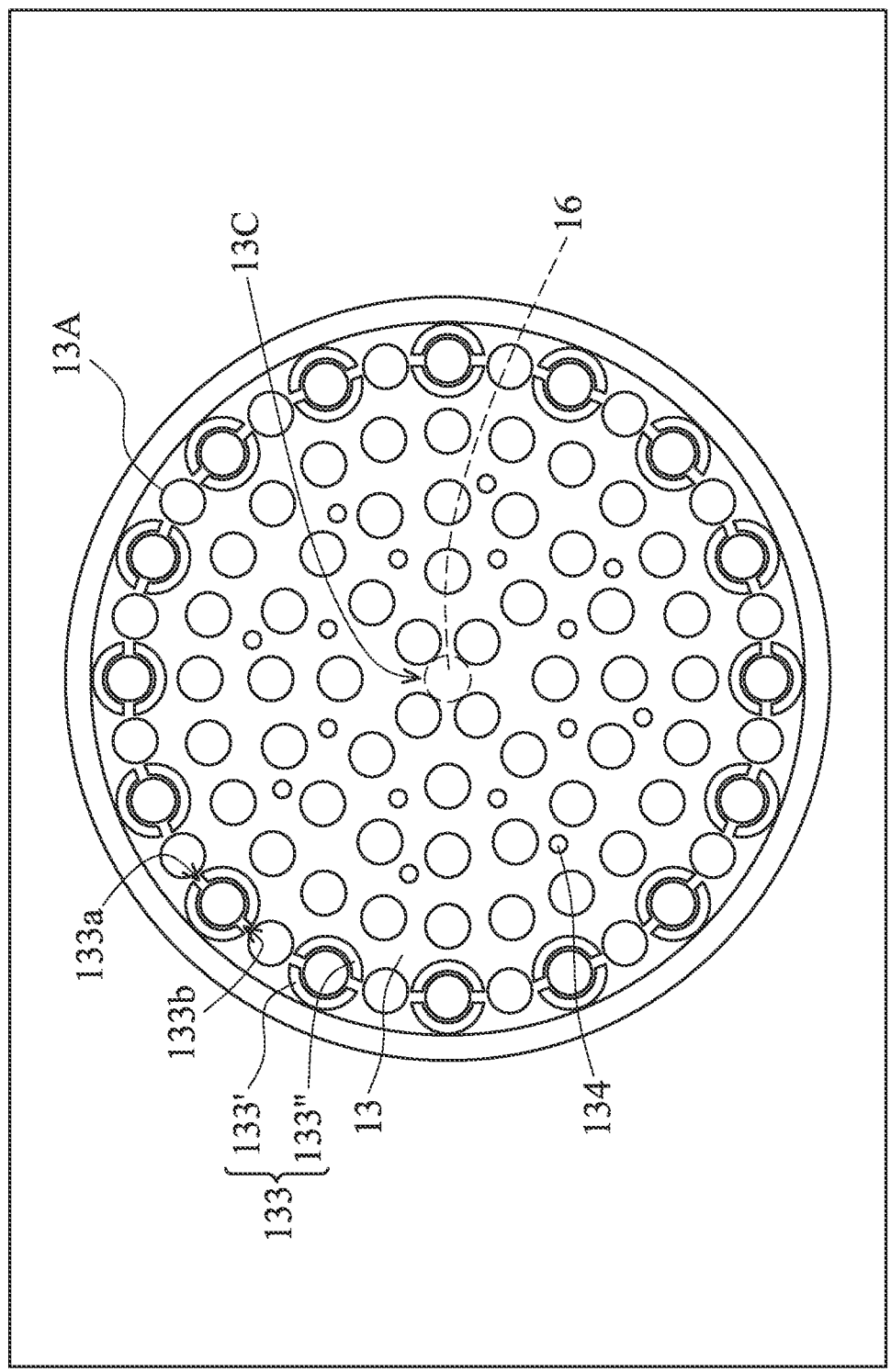
FIG. 9C shows a top view of a MEMS microphone in accordance with one embodiment of the present disclosure.

In accordance with some embodiments of the present disclosure, FIG. 9C shows a top view of a micro-electro-mechanical system (MEMS) microphone M.

The embodiment shown in FIG. 9C is similar to that shown in FIG. 9B. The main difference from FIG. 9B is the configuration of the first protrusion.

In FIG. 9C, the first protrusion 133 forms two arcs (133' and 133") around the acoustic hole 13A from a top view. In some embodiments, the first protrusion 133 leaves at least one opening for process requirements. For example, the first protrusion 133 leaves two openings (133a and 133b), as shown in FIG. 9C, but the present disclosure is not limited thereto.

Figure 10A:
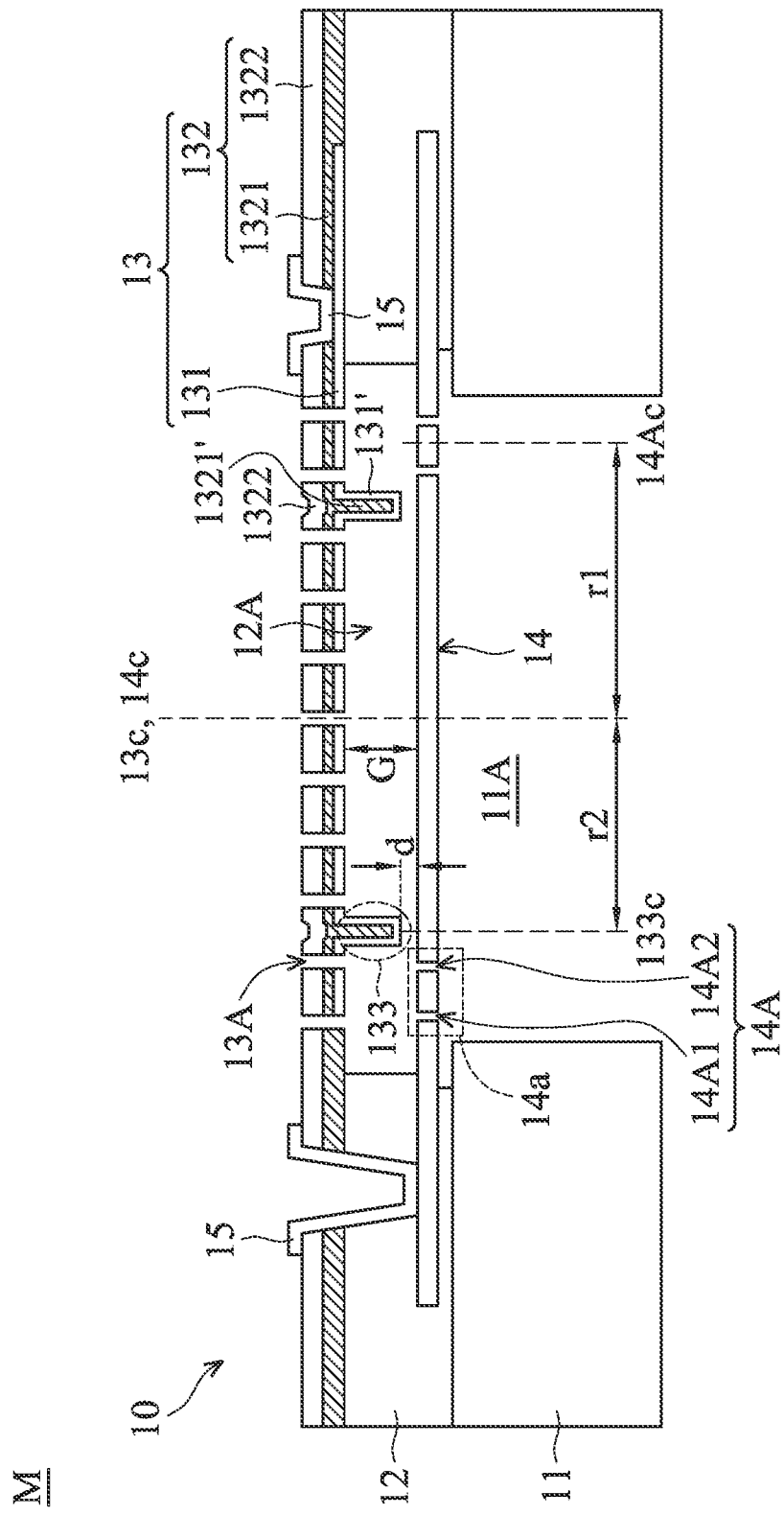
FIG. 10A shows a cross-sectional view of a MEMS microphone in accordance with one embodiment of the present disclosure.
Figure 10B:
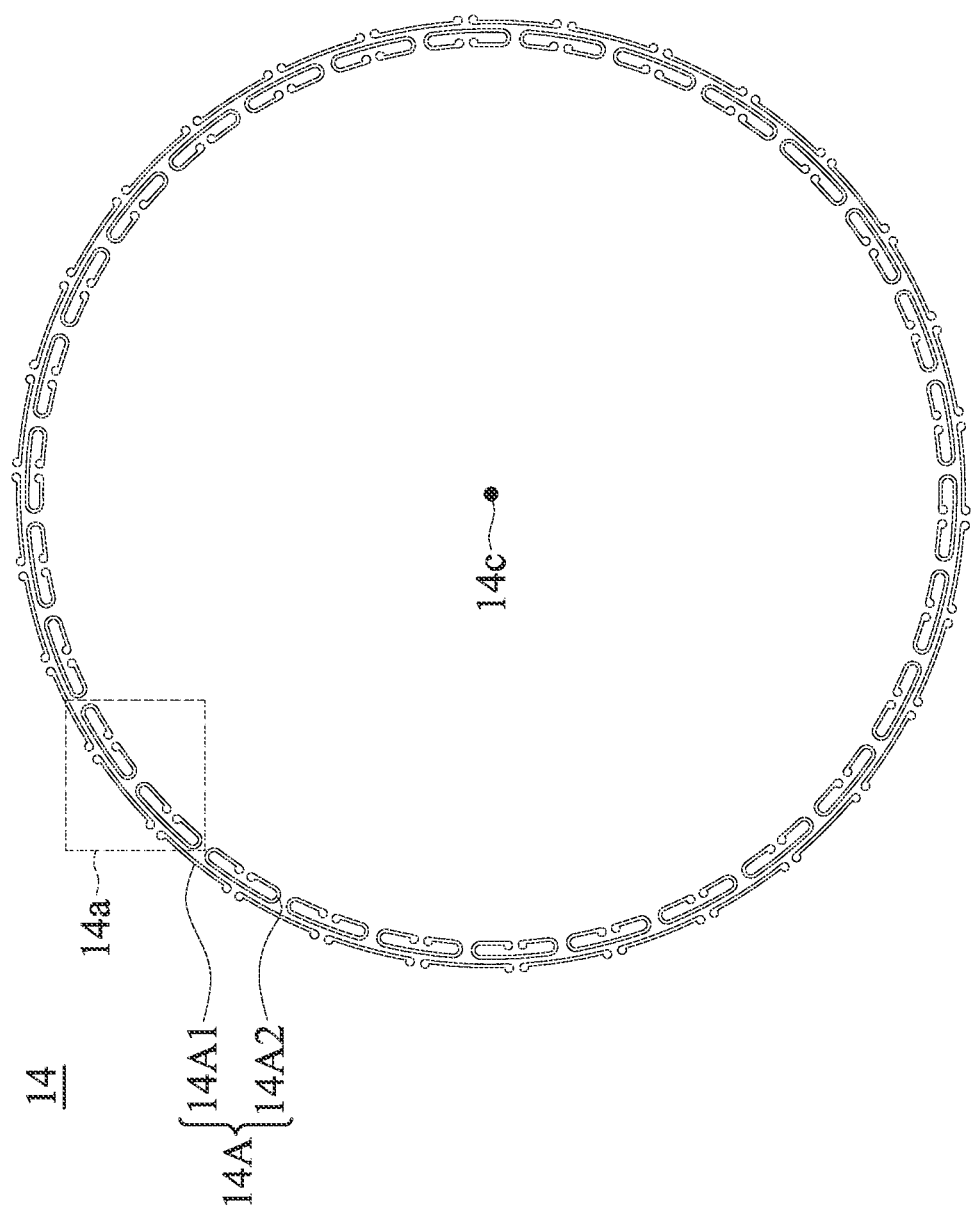
FIG. 10B shows a top view of a MEMS microphone in accordance with one embodiment of the present disclosure.

In accordance with some embodiments of the present disclosure, FIG. 10A shows a cross-sectional view of a micro-electro-mechanical system (MEMS) microphone M. FIG. 10B shows a top view of the MEMS microphone M.

The embodiment shown in FIGS. 10A and 10B is similar to that shown in FIG. 1A. The main difference from FIG. 1A is the configuration of the ventilation holes.

In FIGS. 10A and 10B, the ventilation holes 14A include a plurality of outer slots 14A1 and inner slots 14A2 formed in an annular area 14a of the diaphragm 14 and configured in concentric circles around the center 14c of the diaphragm 14. The outer slots 14A1 and the inner slots 14A2 respectively have a c-shaped structure and are oriented toward opposite directions, and the outer slots 14A1 and the inner slots 14A2 are arranged in a staggered manner with respect to the center 14c of the diaphragm 14, as shown in FIG. 10B.

In the present disclosure, the protrusions from the backplate limit the deformation of the diaphragm and reduce stress, thereby enhancing the reliability of the microphone against air pressure.

In the present disclosure, the MEMS microphone structure has the protrusions from the backplate. When the pressure is induced by the air gun, the diaphragm of the microphone has large deformation and stress because of the large pressure difference. However, the protrusions from the backplate can limit the deformation of the diaphragm which can reduce the stress to prevent cracking.

In the present disclosure, there are two advantages of the polyline (curve) protrusion structure than the single-point protrusion. First, the polyline (curve) protrusion structure has a larger area which can decrease the stress on the diaphragm when there is a collision between the diaphragm and the protrusions. Second, the polyline (curve) protrusion structure has higher stiffness which can prevent breakage if a collision does take place. Therefore, the polyline (curve) design of the protrusions can increase the reliability of the protrusions and the diaphragm, and at the same time improve the reliability of the microphone against air pressure.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A micro-electro-mechanical system (MEMS) microphone, comprising:
    a substrate having an opening portion;
    a diaphragm disposed on one side of the substrate and extending across the opening portion of the substrate;
    a backplate comprising a plurality of acoustic holes disposed on one side of the diaphragm and forming an air gap with the diaphragm; and
    a first protrusion extending from the backplate towards the air gap, wherein the first protrusion forms a polyline or a curve from a top view, and a distance between the first protrusion and the diaphragm is greater than 0.1 µm.

2. The micro-electro-mechanical system (MEMS) microphone as claimed in claim 1, wherein the diaphragm comprises a ventilation hole.

3. The micro-electro-mechanical system (MEMS) microphone as claimed in claim 2, wherein a distance between a center of the backplate and a center of the ventilation hole is defined as a first distance, a distance between the center of the backplate and a center of the first protrusion is defined as a second distance, and the first distance is greater than the second distance.

4. The micro-electro-mechanical system (MEMS) microphone as claimed in claim 2, wherein the ventilation hole comprises a plurality of outer slots and inner slots formed in an annular area of the diaphragm and configured in concentric circles around a center of the diaphragm, wherein the outer slots and the inner slots respectively have a c-shaped structure and are oriented toward opposite directions, and the outer slots and the inner slots are arranged in a staggered manner with respect to the center of the diaphragm.

5. The micro-electro-mechanical system (MEMS) microphone as claimed in claim 1, further comprising a protective layer covering the first protrusion.

6. The micro-electro-mechanical system (MEMS) microphone as claimed in claim 5, wherein the protective layer comprises conductive material.

7. The micro-electro-mechanical system (MEMS) microphone as claimed in claim 1, further comprising a second protrusion extending from the backplate towards the air gap, wherein the second protrusion has a height that is lower than that of the first protrusion.

8. The micro-electro-mechanical system (MEMS) microphone as claimed in claim 7, further comprising a third protrusion extending from the backplate towards the air gap, wherein the third protrusion is located between the second protrusions.

9. The micro-electro-mechanical system (MEMS) microphone as claimed in claim 8, wherein the third protrusion is located on a center of the backplate.

10. The micro-electro-mechanical system (MEMS) microphone as claimed in claim 8, wherein the third protrusion has a height similar to that of the first protrusion.

11. The micro-electro-mechanical system (MEMS) microphone as claimed in claim 8, wherein the third protrusion surrounds at least one acoustic hole and forms a closed ring or polyline from a top view.

12. The micro-electro-mechanical system (MEMS) microphone as claimed in claim 8, wherein the first protrusion, the second protrusion and the third protrusion comprise insulating materials.

13. The micro-electro-mechanical system (MEMS) microphone as claimed in claim 8, wherein the third protrusion forms a closed ring or polyline from a top view.

14. The micro-electro-mechanical system (MEMS) microphone as claimed in claim 1, wherein the first protrusion surrounds at least one acoustic hole.

15. The micro-electro-mechanical system (MEMS) microphone as claimed in claim 1, wherein the first protrusion leaves at least one opening.

16. The micro-electro-mechanical system (MEMS) microphone as claimed in claim 15, wherein the first protrusion surrounds the at least one acoustic hole and leaves two or four openings.

17. The micro-electro-mechanical system (MEMS) microphone as claimed in claim 1, further comprising a pillar disposed on the backplate, wherein the pillar is disposed on a center of the backplate and is in contact with the diaphragm.

18. The micro-electro-mechanical system (MEMS) microphone as claimed in claim 1, wherein the first protrusion has a width greater than 0.5 µm.

19. The micro-electro-mechanical system (MEMS) microphone as claimed in claim 1, wherein the first protrusion forms two arcs around the acoustic hole from a top view.

20. The micro-electro-mechanical system (MEMS) microphone as claimed in claim 1, wherein the first protrusion is distributed along a center of the diaphragm.

* * * * *